United States Patent
Kurimoto

(10) Patent No.: US 9,285,433 B2
(45) Date of Patent: Mar. 15, 2016

(54) BATTERY MANAGEMENT SYSTEM, BATTERY MANAGEMENT APPARATUS, METHOD OF REUSING BATTERY, AND INFORMATION COMMUNICATION TERMINAL APPARATUS

(75) Inventor: Yasuhide Kurimoto, Kasugai (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 698 days.

(21) Appl. No.: 13/703,389

(22) PCT Filed: Apr. 18, 2011

(86) PCT No.: PCT/JP2011/059502
§ 371 (c)(1),
(2), (4) Date: Dec. 11, 2012

(87) PCT Pub. No.: WO2011/162014
PCT Pub. Date: Dec. 29, 2011

(65) Prior Publication Data
US 2013/0090872 A1    Apr. 11, 2013

(30) Foreign Application Priority Data

Jun. 24, 2010    (JP) .................................. 2010-144024

(51) Int. Cl.
*G01R 31/36* (2006.01)
*B60L 3/00* (2006.01)
(Continued)

(52) U.S. Cl.
CPC ........... *G01R 31/3679* (2013.01); *B60L 3/0046* (2013.01); *B60L 3/12* (2013.01); *B60L 11/1857* (2013.01); *B60L 11/1861* (2013.01); *G06F 15/00* (2013.01); *H01M 10/482* (2013.01);
(Continued)

(58) Field of Classification Search
CPC ............... G01R 31/36; G01R 31/3679; G01R 31/3658–31/3662; G01R 31/3606–31/3627; G01R 31/3682
See application file for complete search history.

(56) References Cited

U.S. PATENT DOCUMENTS 5,349,535 A * 9/1994 Gupta ................. B60L 11/1818
320/106
7,616,002 B2 * 11/2009 Quint et al. ........... H01M 10/48
324/426
(Continued)

FOREIGN PATENT DOCUMENTS

| JP | 2002-15781 | 1/2002 |
|---|---|---|
| JP | 2004-289953 | 10/2004 |
| JP | 2006-228490 | 8/2006 |
| JP | 2007-141464 | 6/2007 |

(Continued)

*Primary Examiner* — Mischita Henson
(74) *Attorney, Agent, or Firm* — Finnegan, Henderson, Farabow, Garrett & Dunner, LLP

(57) ABSTRACT

Provided is a method of reusing a battery, a battery management system, a battery management apparatus, and an information communication terminal apparatus, wherein, upon retrieving batteries mounted on vehicles, methods of handling the retrieved batteries can be determined at low cost. Measurement data of each of a plurality of stacks constituting a battery pack are transmitted to a data station. The data station stores the received measurement data in a history information storage unit as history information. When history information of a battery pack mounted on a scrapped vehicle is not stored in the history information storage unit of the data station, that battery pack is subjected to recycle processing. When history information thereof is stored in the history information storage unit of the data station, a method of reusing the battery pack is determined on the basis of the history information.

25 Claims, 11 Drawing Sheets

(51) Int. Cl.
  *B60L 3/12* (2006.01)
  *B60L 11/18* (2006.01)
  *H01M 10/48* (2006.01)
  *H01M 10/54* (2006.01)
  *G06F 15/00* (2006.01)
  *H04Q 9/00* (2006.01)

(52) U.S. Cl.
  CPC .............. *H01M 10/54* (2013.01); *H04Q 9/00* (2013.01); *G01R 31/3662* (2013.01); *H04Q 2209/47* (2013.01); *H04Q 2209/75* (2013.01); *Y02T 10/705* (2013.01); *Y02T 10/7005* (2013.01); *Y02T 10/7044* (2012.01); *Y02T 90/16* (2013.01); *Y02W 30/84* (2015.05)

(56) References Cited

U.S. PATENT DOCUMENTS

| | | |
|---|---|---|
| 2001/0035737 A1 | 11/2001 | Nakanishi et al. |
| 2007/0108946 A1 | 5/2007 | Yamauchi et al. |
| 2009/0033277 A1* | 2/2009 | Ludtke ............ H02J 7/0004 320/106 |
| 2009/0089077 A1 | 4/2009 | Yoshikawa et al. |
| 2010/0188039 A1 | 7/2010 | Yamauchi et al. |

FOREIGN PATENT DOCUMENTS

| | | |
|---|---|---|
| JP | 2007-165040 | 6/2007 |
| JP | 2009-96163 | 5/2009 |

* cited by examiner

BATTERY MANAGEMENT SYSTEM, BATTERY MANAGEMENT APPARATUS, METHOD OF REUSING BATTERY, AND INFORMATION COMMUNICATION TERMINAL APPARATUS

CROSS-REFERENCE TO RELATED APPLICATIONS

This application is a national phase application of International Application No. PCT/JP2011/059502, filed Apr. 18, 2011, and claims the priority of Japanese Application No. 2010-144024, filed Jun. 24, 2010, the content of both of which is incorporated herein by reference.

TECHNICAL FIELD

The invention relates to a battery management system, a battery management apparatus, a method of reusing battery, and an information communication terminal apparatus, more particularly to a battery management system, a battery management apparatus, a method of reusing battery, and an information communication terminal apparatus, wherein states of a battery mounted on a vehicle or a large home electric appliance are checked and used to decide a method of reusing the battery.

BACKGROUND ART

An increasing number of hybrid cars and electric automobiles are recently developed and launched in the market as a solution of environmental problems. Any on-vehicle batteries mounted on these vehicles are used over an extended period of time as compared to other electric appliances. These vehicles, when they are no longer of use, are disassembled, and the batteries mounted therein are retrieved. The batteries mounted on forklifts and large electronic appliances are similarly retrieved.

Some of these re-collected batteries are reusable, while the others are not. To determine the reusability of any retrieved batteries, it was technically developed to collect information of batteries when vehicles are discarded. Patent Document 1 discloses a technical means for storing information of a battery in an RFID tag beforehand, wherein information of an operation history record including operation management data during charging is stored in a noncontact readable/writable RFID tag and read from the tag when the vehicle is discarded, and the read information is used as criteria on deciding whether the battery is recyclable.

Patent Document 2 discloses a maintenance and management method wherein a remaining life of a secondary battery is estimated and used in maintenance and management of the secondary battery. According to the maintenance and management method, data of the secondary battery, such as temperature, voltage, impedance, and charge/discharge current, are detected and transferred to a server by a communication tool, so that a serviceman of a manufacturer of the battery performs maintenance of the secondary battery based on the transferred data.

RELATED ART DOCUMENTS

Patent Documents

Patent Document 1: JP-A-2006-228490
Patent Document 2: JP-A-2007-165040

SUMMARY OF INVENTION

Problems to be Solved by the Invention

There are different options for reusing the recovered batteries; recycling, reusing, and rebuilding. The recycling is to scrap a battery to recycle as raw materials, the reusing is to directly reuse a recovered battery pack, and the rebuilding is to gather and combine some disassembled reusable battery cells and stacks into the form of a whole battery pack as described later. Patent Document 1 fails to specifically disclose any decision criteria how the collected batteries should be handled. Patent Document 2 discloses an information collector wherein battery-related information is collected by a communication tool. This document, however, fails to specifically disclose any decision criteria for recycling.

The invention was accomplished to solve the conventional technical problems. Specifically, the invention has a purpose to provide a battery management system, a battery management apparatus, a method of reusing battery, and an information communication terminal apparatus technically advantageous in that a handling method of a battery retrieved from a battery-mounted equipment, such as a vehicle, is decided with low cost.

Means of Solving the Problems

To achieve the above purpose, one aspect of the invention provides a battery management system including: an identification information storage unit for storing therein identification information of a battery pack having a plurality of constitutive batteries; a measurement unit for measuring state information relating to a degree of degradation of each of the constitutive batteries; a transmitter for transmitting the identification information of the battery pack and measured value data obtained by the measurement unit; a receiver for receiving the identification information and the measured value data transmitted from the transmitter; a history record information storage unit for storing therein the measured value data received by the receiver as history record information in a manner that associates with the identification information of the battery pack; and a decision unit for deciding a method of reusing the battery pack or the constitutive batteries based on the history record information stored in the history record information storage unit, wherein the decision unit includes: a history record presence/absence decision unit for determining whether or not the history record information of the battery pack is stored in the history record information storage unit; and a battery handling method decision unit configured to: decide that the battery pack is unreusable when it is determined that the history record information of the battery pack is not stored in the history record information storage unit; and determine whether or not the constitutive batteries of the battery pack are reusable based on the history record information of the constitutive batteries when it is determined that the history record information of the battery pack is stored in the history record information storage unit. This battery management system can decide a method of reusing a battery mounted on any battery-mounted equipment based on the history record information of the battery. The battery management system, wherein it is unnecessary to retest the retrieved battery to check its degree of degradation, can decide a method of handling the battery in a time-saving manner and avoid any additional cost necessitated by such a retest.

In the above battery management system, preferably, the battery handling method decision unit is configured to: decide to reuse the battery pack when it is determined that all of the constitutive batteries of the battery pack are reusable; and: decide to recycle the battery pack when it is determined that none of the constitutive batteries of the battery pack is reusable. This requires less time to decide the battery handling method.

In the above battery management system, preferably, the battery handling method decision unit is configured to: when it is determined that a part of the constitutive batteries is reusable but other ones of the constitutive batteries are unreusable, decide to gather and combine reusable ones of the constitutive batteries of the battery pack in the form of a battery pack anew, and decide to recycle the unreusable constitutive batteries. This ensures effective use of any reusable constitutive batteries.

Another aspect of the invention provides a battery management system including: an identification information storage unit for storing therein identification information of a battery having a constitutive battery cell; a measurement unit for measuring state information relating to a degree of degradation of the constitutive battery; a transmitter for transmitting the identification information of the battery and measured value data obtained by the measurement unit; a receiver for receiving the identification information and the measured value data transmitted from the transmitter; a history record information storage unit for storing therein the measured value data received by the receiver as history record information in a manner that associates with the identification information of the battery; and a decision unit for deciding a method of reusing the battery based on the history record information stored in the history record information storage unit, wherein the decision unit includes: a history record presence/absence decision unit for determining whether or not the history record information of the battery is stored in the history record information storage unit; and a battery handling method decision unit configured to: decide that the battery is unreusable when it is determined that the history record information of the battery is not stored in the history record information storage unit, and determine whether or not the constitutive battery is reusable based on the history record information of the constitutive battery when it is determined that the history record information of the battery is stored in the history record information storage unit, and the battery handling method decision unit is configured to: decide to reuse the battery when it is determined that the battery is reusable, and decide to recycle the battery when it is determined that the battery is unreusable. The battery management system can decide a method of reusing a battery mounted on any battery-mounted equipment based on the history record information of the battery.

In the above battery management system, preferably, the measurement unit is configured to measure at least a full charge capacity of the constitutive battery, and the battery handling method decision unit is configured to determine that: the constitutive battery is unreusable when it is determined that the history record information of the constitutive battery is stored in the history record information storage unit and the full charge capacity is equal to or lower than a predefined reusability threshold of the full charge capacity, and the constitutive battery is reusable when it is determined that the history record information of the constitutive battery is stored in the history record information storage unit unless the constitutive battery is determined as unreusable. Accordingly, whether or not the battery is reusable is determined based on the full charge capacity which is one of indicators used to assess a degree of degradation of the battery.

In the above battery management system, preferably, the measurement unit is configured to measure at least a full charge capacity of the constitutive battery, and the battery handling method decision unit is configured to determined that: the constitutive battery is unreusable when it is determined that the history record information of the constitutive battery is stored in the history record information storage unit and a quantity of change of the full charge capacity is equal to or more than a predefined reusability threshold of the quantity of change of the full charge capacity, and the constitutive battery is reusable when it is determined that the history record information of the constitutive battery is stored in the history record information storage unit unless the constitutive battery is determined as unreusable. Accordingly, whether or not the battery is reusable is determined based on the quantity of change of the full charge capacity which is one of indicators used to assess a degree of degradation of the battery.

In the above battery management system, preferably, the measurement unit is configured to measure at least a full charge capacity of the constitutive battery, and the battery handling method decision unit is configured to determined that: the constitutive battery is unreusable when it is determined that the history record information of the constitutive battery is stored in the history record information storage unit and a variation of a quantity of change of the full charge capacity is equal to or more than a predefined reusability threshold of the variation of the quantity of change of the full charge capacity, and the constitutive battery is reusable when it is determined that the history record information of the constitutive battery is stored in the history record information storage unit unless the constitutive battery is determined as unreusable. Accordingly, whether or not the battery is reusable is determined based on the variation of the quantity of change of the full charge capacity which is one of indicators used to assess a degree of degradation of the battery.

In the above battery management system, preferably, the measurement unit is configured to measure at least a full charge capacity of the constitutive battery, and the battery handling method decision unit is configured to determined that: the constitutive battery is unreusable when it is determined that the history record information of the constitutive battery is stored in the history record information storage unit and a difference between the measured full charge capacity and an initial value of the full charge capacity is equal to or more than a predefined reusability threshold of the initial value of the full charge capacity, and the constitutive battery is reusable when it is determined that the history record information of the constitutive battery is stored in the history record information storage unit unless the constitutive battery is determined as unreusable. Accordingly, whether or not the battery is reusable is determined based on the quantity of change of the full charge capacity from its initial value which is one of indicators used to assess a degree of degradation of the battery.

In the above battery management system, preferably, the measurement unit is configured to measure at least internal resistance of the constitutive battery, and the battery handling method decision unit is configured to determined that: the constitutive battery is unreusable when it is determined that the history record information of the constitutive battery is stored in the history record information storage unit and the internal resistance is equal to or more than a predefined reusability threshold of the internal resistance, and the constitutive battery is reusable when it is determined that the history record information of the constitutive battery is stored in the history record information storage unit unless the constitutive battery is determined as unreusable. Accordingly, whether or not the battery is reusable is determined based on the internal resistance which is one of indicators used to assess a degree of degradation of the battery.

In the above battery management system, preferably, the measurement unit is configured to measure at least internal resistance of the constitutive battery, and the battery handling method decision unit is configured to determined that: the constitutive battery is unreusable when it is determined that the history record information of the constitutive battery is stored in the history record information storage unit and a quantity of change of the internal resistance is equal to or more than a predefined reusability threshold of the quantity of change of the internal resistance, and the constitutive battery is reusable when it is determined that the history record information of the constitutive battery is stored in the history record information storage unit unless the constitutive battery is determined as unreusable. Accordingly, whether or not the battery is reusable is determined based on the quantity of change of the internal resistance which is one of indicators used to assess a degree of degradation of the battery.

In the above battery management system, preferably, the measurement unit is configured to measure at least internal resistance of the constitutive battery, and the battery handling method decision unit is configured to determine that: the constitutive battery is unreusable when it is determined that the history record information of the constitutive battery is stored in the history record information storage unit and a variation of a quantity of change of the internal resistance is equal to or more than a predefined reusability threshold of the variation of the quantity of change of the internal resistance, and the constitutive battery is reusable when it is determined that the history record information of the constitutive battery is stored in the history record information storage unit unless the constitutive battery is determined as unreusable. Accordingly, whether or not the battery is reusable is determined based on the variation of the quantity of change of the internal resistance which is one of indicators used to assess a degree of degradation of the battery.

In the above battery management system, preferably, the measurement unit is configured to measure at least internal resistance of the constitutive battery, and the battery handling method decision unit is configured to determined that: the constitutive battery is unreusable when it is determined that the history record information of the constitutive battery is stored in the history record information storage unit and a difference between the measured internal resistance and an initial value of the internal resistance is equal to or more than a predefined reusability threshold of the initial value of the internal resistance, and the constitutive battery is reusable when it is determined that the history record information of the constitutive battery is stored in the history record information storage unit unless the constitutive battery is determined as unreusable. Accordingly, whether or not the battery is reusable is determined based on the quantity of change of the internal resistance from its initial value which is one of indicators used to assess a degree of degradation of the battery.

The above battery management system preferably further includes a battery-mounted equipment, a battery information management unit, and an external battery charger, wherein the battery-mounted equipment includes the battery pack having the identification storage unit and the measurement unit, the battery information management unit includes the receiver, the history record information storage unit, and the decision unit, and the external battery charger includes the transmitter and a charger for charging the battery pack. Accordingly, the status information of the battery can be transmitted by the external battery charger.

The above battery management system preferably further includes a battery-mounted equipment, a battery information management unit, and a battery information acquisition device, wherein the battery-mounted equipment includes the battery pack having the identification storage unit and the measurement unit, the battery information management unit includes the receiver, the history record information storage unit, and the decision unit, and the battery information acquisition device includes the transmitter and a storage unit for storing therein the state information of the constitutive battery. Accordingly, the status information of the battery can be transmitted by the battery information acquisition device.

The above battery management system preferably further includes a battery-mounted equipment and a battery information management unit, wherein the battery-mounted equipment includes the battery pack having the identification information storage unit, the measurement unit, and the transmitter, and the battery information management unit includes the receiver, the history record information storage unit, and the decision unit. Accordingly, the status information of the battery can be transmitted to the battery information management unit directly from the battery-mounted equipment.

In the above battery management system, preferably, the constitutive battery is a battery cell. Accordingly, the reusability can be determined per battery cell so that any reusable battery cell is effectively used.

In the above battery management system, preferably, the constitutive battery is a stack having a combination of a plurality of battery cells. Accordingly, the reusability can be determined per stack. It takes less processing steps to combine the plural stacks in the form of a battery pack, leading to cost reduction.

Furthermore, another aspect of the invention provides a battery management apparatus includes: a receiver for receiving identification information of a battery pack and measured value data of state information relating to a degree of degradation of each of constitutive batteries of the battery pack; a history record information storage unit for storing therein the measured value data received by the receiver as history record information in a manner that associates with the identification information of the battery pack; and a decision unit for deciding a method of reusing the battery pack or the constitutive batteries based on the history record information stored in the history record information storage unit, wherein the decision unit includes: a history record presence/absence decision unit for determining whether or not the history record information of the battery pack is stored in the history record information storage unit; and a battery handling method decision unit configured to: decide that the battery pack is unreusable when it is determined that the history record information of the battery pack is not stored in the history record information storage unit; and determine whether or not the constitutive batteries of the battery pack are reusable based on the history record information of the constitutive batteries when it is determined that the history record information of the battery pack is stored in the history record information storage unit. The battery management apparatus can decide a method of reusing a battery mounted on any battery-mounted equipment based on the history record information of the battery. The battery management apparatus, wherein it is unnecessary to retest the retrieved battery to check its degree of degradation, can decide a method of handling the battery in a time-saving manner and avoid any additional cost necessitated by such a retest.

In the above battery management apparatus, preferably, the battery handling method decision unit is configured to: decide to reuse the battery pack when it is determined that all of the constitutive batteries of the battery pack are reusable; and: decide to recycle the battery pack when it is determined that none of the constitutive batteries of the battery pack is reusable. This requires less time to decide the battery handling method.

In the above battery management apparatus, preferably, the battery handling method decision unit is configured to: when it is determined that a part of the constitutive batteries is reusable but other ones of the constitutive batteries are unreusable, decide to gather and combine reusable ones of the constitutive batteries of the battery pack in the form of a battery pack anew, and decide to recycle the unreusable constitutive batteries. This ensures effective use of any reusable constitutive batteries.

Another aspect of the invention provides a battery management apparatus includes: a receiver for receiving identification information of a battery having a constitutive battery cell and measured value data of state information relating to a degree of degradation of the constitutive battery; a history record information storage unit for storing therein the measured value data received by the receiver as history record information in a manner that associates with the identification information of the battery; and a decision unit for deciding a method of reusing the battery based on the history record information stored in the history record information storage unit, wherein the decision unit includes: a history record presence/absence decision unit for determining whether or not the history record information of the battery is stored in the history record information storage unit; and a battery handling method decision unit configured to: decide that the battery is unreusable when it is determined that the history record information of the battery is not stored in the history record information storage unit, and determine whether or not the constitutive battery is reusable based on the history record information of the constitutive battery when it is determined that the history record information of the battery is stored in the history record information storage unit, and the battery handling method decision unit is configured to: decide to reuse the battery when it is determined that the battery is reusable, and decide to recycle the battery when it is determined that the battery is unreusable. The battery management apparatus can decide a method of reusing a battery mounted in any battery-mounted equipment based on the history record information of the battery.

In the above battery management apparatus, preferably, the measurement unit is configured to measure at least a full charge capacity of the constitutive battery, and the battery handling method decision unit is configured to determine that: the constitutive battery is unreusable when it is determined that the history record information of the constitutive battery is stored in the history record information storage unit and the full charge capacity is equal to or lower than a predefined reusability threshold of the full charge capacity, and the constitutive battery is reusable when it is determined that the history record information of the constitutive battery is stored in the history record information storage unit unless the constitutive battery is determined as unreusable. Accordingly, whether or not the battery is reusable is determined based on the full charge capacity which is one of indicators used to assess a degree of degradation of the battery.

In the above battery management apparatus, preferably, the measurement unit is configured to measure at least a full charge capacity of the constitutive battery, and the battery handling method decision unit is configured to determined that: the constitutive battery is unreusable when it is determined that the history record information of the constitutive battery is stored in the history record information storage unit and a quantity of change of the full charge capacity is equal to or more than a predefined reusability threshold of the quantity of change of the full charge capacity, and the constitutive battery is reusable when it is determined that the history record information of the constitutive battery is stored in the history record information storage unit unless the constitutive battery is determined as unreusable. Accordingly, whether or not the battery is reusable is determined based on the quantity of change of the full charge capacity which is one of indicators used to assess a degree of degradation of the battery.

In the above battery management apparatus, preferably, the measurement unit is configured to measure at least a full charge capacity of the constitutive battery, and the battery handling method decision unit is configured to determined that: the constitutive battery is unreusable when it is determined that the history record information of the constitutive battery is stored in the history record information storage unit and a variation of a quantity of change of the full charge capacity is equal to or more than a predefined reusability threshold of the variation of the quantity of change of the full charge capacity, and the constitutive battery is reusable when it is determined that the history record information of the constitutive battery is stored in the history record information storage unit unless the constitutive battery is determined as unreusable. Accordingly, whether or not the battery is reusable is determined based on the variation of the quantity of change of the full charge capacity which is one of indicators used to assess a degree of degradation of the battery.

In the above battery management apparatus, preferably, the measurement unit is configured to measure at least a full charge capacity of the constitutive battery, and the battery handling method decision unit is configured to determined that: the constitutive battery is unreusable when it is determined that the history record information of the constitutive battery is stored in the history record information storage unit and a difference between the measured full charge capacity and an initial value of the full charge capacity is equal to or more than a predefined reusability threshold of the initial value of the full charge capacity, and the constitutive battery is reusable when it is determined that the history record information of the constitutive battery is stored in the history record information storage unit unless the constitutive battery is determined as unreusable. Accordingly, whether or not the battery is reusable is determined based on the quantity of change of the full charge capacity from its initial value which is one of indicators used to assess a degree of degradation of the battery.

In the above battery management apparatus, preferably, the measurement unit is configured to measure at least internal resistance of the constitutive battery, and the battery handling method decision unit is configured to determined that: the constitutive battery is unreusable when it is determined that the history record information of the constitutive battery is stored in the history record information storage unit and the internal resistance is equal to or more than a predefined reusability threshold of the internal resistance, and the constitutive battery is reusable when it is determined that the history record information of the constitutive battery is stored in the history record information storage unit unless the constitutive battery is determined as unreusable. Accordingly, whether or not the battery is reusable is determined based on the internal resistance which is one of indicators used to assess a degree of degradation of the battery.

In the above battery management apparatus, preferably, the measurement unit is configured to measure at least internal resistance of the constitutive battery, and the battery handling method decision unit is configured to determined that: the constitutive battery is unreusable when it is determined that the history record information of the constitutive battery is stored in the history record information storage unit and a quantity of change of the internal resistance is equal to or more than a predefined reusability threshold of the quantity of change of the internal resistance, and the constitutive battery is reusable when it is determined that the history record information of the constitutive battery is stored in the history record information storage unit unless the constitutive battery is determined as unreusable. Accordingly, whether or not the battery is reusable is determined based on the quantity of change of the internal resistance which is one of indicators used to assess a degree of degradation of the battery.

In the above battery management apparatus, preferably, the measurement unit is configured to measure at least internal resistance of the constitutive battery, and the battery handling method decision unit is configured to determine that: the constitutive battery is unreusable when it is determined that the history record information of the constitutive battery is stored in the history record information storage unit and a variation of a quantity of change of the internal resistance is equal to or more than a predefined reusability threshold of the variation of the quantity of change of the internal resistance, and the constitutive battery is reusable when it is determined that the history record information of the constitutive battery is stored in the history record information storage unit unless the constitutive battery is determined as unreusable. Accordingly, whether or not the battery is reusable is determined based on the variation of the quantity of change of the internal resistance which is one of indicators used to assess a degree of degradation of the battery.

In the above battery management apparatus, preferably, the measurement unit is configured to measure at least internal resistance of the constitutive battery, and the battery handling method decision unit is configured to determined that: the constitutive battery is unreusable when it is determined that the history record information of the constitutive battery is stored in the history record information storage unit and a difference between the measured internal resistance and an initial value of the internal resistance is equal to or more than a predefined reusability threshold of the initial value of the internal resistance, and the constitutive battery is reusable when it is determined that the history record information of the constitutive battery is stored in the history record information storage unit unless the constitutive battery is determined as unreusable. Accordingly, whether or not the battery is reusable is determined based on the quantity of change of the internal resistance from its initial value which is one of indicators used to assess a degree of degradation of the battery.

In the above battery management apparatus, preferably, the constitutive battery is a battery cell. Thus, the reusability can be determined per battery cell so that any reusable battery cell is effectively used.

In the above battery management apparatus, preferably, the constitutive battery is a stack having a combination of a plurality of battery cells. It takes less processing steps to combine the plural stacks in the form of a battery pack, leading to cost reduction.

Another aspect of the invention provides a method of reusing battery includes steps of: measuring state information relating to a degree of degradation of each of a plurality of constitutive batteries by using a measurement unit; transmitting measured value data outside from a battery-mounted equipment by using a transmitter; receiving the transmitted measured value data by using a receiver; storing the received measured value data as history record information of the battery pack and the constitutive batteries in a history record information storage unit; and deciding a method of handling the battery pack or the constitutive batteries based on the history record information by using a decision unit, wherein the decision unit determines whether or not the history record information of the battery pack is stored in the history record information storage unit, the decision unit decides that the battery pack is unreusable when it is determined that the history record information of the battery pack is not stored in the history record information storage unit, and the decision unit determines whether or not the constitutive batteries of the battery pack are reusable based on the history record information of the constitutive batteries when it is determined that the history record information of the battery pack is stored in the history record information storage unit. This battery reusing method can decide a method of reusing a battery mounted on any battery-mounted equipment based on the history record information of the battery. The battery reusing method, wherein it is unnecessary to retest the retrieved battery to check its degree of degradation, can decide a method of handling the battery in a time-saving manner and avoid any additional cost necessitated by such a retest.

In the above method of reusing battery, preferably, the decision unit decides to reuse the battery pack when it is determined that all of the constitutive batteries of the battery pack are reusable, and the decision unit decides to recycle the battery pack when it is determined that none of the constitutive batteries of the battery pack is reusable. This requires less time to decide the battery handling method.

In the above method of reusing battery, preferably, when it is determined that a part of the constitutive batteries is reusable but other ones of the constitutive batteries are unreusable, the decision unit decides to gather and combine reusable ones of the constitutive batteries of the battery pack in the form of a battery pack anew, and the decision unit decides to recycle the unreusable constitutive batteries. This ensures effective use of any reusable constitutive batteries.

In the above method of reusing battery, preferably, when the decision unit decides to gather and combine reusable ones of the constitutive batteries of the battery pack in the form of a battery pack anew, the constitutive batteries determined as reusable and reusable ones of constitutive batteries of a battery pack mounted on a battery-mounted equipment owned by a user are combined and used in a rebuilt battery pack. Any constitutive batteries of the battery pack, which are not largely degraded, can be used in the user's battery-mounted equipment.

In the above method of reusing battery, preferably, a degree of degradation of each of the constitutive batteries combined with the constitutive batteries mounted on the battery-mounted equipment is equal to or lower than a degree of degradation of a most degraded one in reusable ones of the constitutive batteries mounted on the battery-mounted equipment. The battery pack thus newly obtained has a battery performance significantly higher than that of the battery pack before rebuilding.

In the above method of reusing battery, preferably, the measurement unit measures at least a full charge capacity of each of the constitutive batteries, and the battery handling method decision unit determines that: the constitutive battery is unreusable when it is determined that the history record information of the constitutive batteries is stored in the history record information storage unit and the full charge capacity is equal to or lower than a predefined reusability threshold of the full charge capacity, and the constitutive battery is reusable when it is determined that the history record information of the constitutive battery is stored in the history record information storage unit unless the constitutive battery is determined as unreusable. Accordingly, whether or not the battery is reusable is determined based on the full charge capacity which is one of indicators used to assess a degree of degradation of the battery.

In the above method of reusing battery, preferably, the measurement unit measures at least a full charge capacity of each of the constitutive batteries, and the battery handling method decision unit determines that: the constitutive battery is unreusable when it is determined that the history record information of the constitutive battery is stored in the history record information storage unit and a quantity of change of the full charge capacity is equal to or more than a predefined reusability threshold of the quantity of change of the full charge capacity, and the constitutive battery is reusable when it is determined that the history record information of the constitutive battery is stored in the history record information storage unit unless the constitutive battery is determined as unreusable. Accordingly, whether or not the battery is reusable is determined based on the quantity of change of the full charge capacity which is one of indicators used to assess a degree of degradation of the battery.

In the above method of reusing battery, preferably, the measurement unit measures at least a full charge capacity of each of the constitutive batteries, and the battery handling method decision unit determines that: the constitutive battery is unreusable when it is determined that the history record information of the constitutive battery is stored in the history record information storage unit and a variation of the quantity of change of the full charge capacity is equal to or more than a predefined reusability threshold of the variation of the quantity of change of the full charge capacity, and the constitutive battery is reusable when it is determined that the history record information of the constitutive battery is stored in the history record information storage unit unless the constitutive battery is determined as unreusable. Accordingly, whether or not the battery is reusable is determined based on the variation of the quantity of change of the full charge capacity which is one of indicators used to assess a degree of degradation of the battery.

In the above method of reusing battery, preferably, the measurement unit measures at least a full charge capacity of each of the constitutive batteries, and the battery handling method decision unit determines that: the constitutive battery is unreusable when it is determined that the history record information of the constitutive battery is stored in the history record information storage unit and a difference between the measured full charge capacity and an initial value of the full charge capacity is equal to or more than a predefined reusability threshold of the initial value of the full charge capacity, and the constitutive battery is reusable when it is determined that the history record information of the constitutive battery is stored in the history record information storage unit unless the constitutive battery is determined as unreusable. Accordingly, whether or not the battery is reusable is determined based on the quantity of change of the full charge capacity from its initial value which is one of indicators used to assess a degree of degradation of the battery.

In the above method of reusing battery, preferably, the measurement unit measures at least internal resistance of each of the constitutive batteries, and the battery handling method decision unit determines that: the constitutive battery is unreusable when it is determined that the history record information of the constitutive battery is stored in the history record information storage unit and the internal resistance is equal to or more than a predefined reusability threshold of the internal resistance, and the constitutive battery is reusable when it is determined that the history record information of the constitutive battery is stored in the history record information storage unit unless the constitutive battery is determined as unreusable. Accordingly, whether or not the battery is reusable is determined based on the internal resistance which is one of indicators used to assess a degree of degradation of the battery.

In the above method of reusing battery, preferably, the measurement unit measures at least internal resistance of each of the constitutive batteries, and the battery handling method decision unit determines that: the constitutive battery is unreusable when it is determined that the history record information of the constitutive battery is stored in the history record information storage unit and a quantity of change of the internal resistance is equal to or more than a predefined reusability threshold of the quantity of change of the internal resistance, and the constitutive battery is reusable when it is determined that the history record information of the constitutive battery is stored in the history record information storage unit unless the constitutive battery is determined as unreusable. Accordingly, whether or not the battery is reusable is determined based on the quantity of change of the internal resistance which is one of indicators used to assess a degree of degradation of the battery.

In the above method of reusing battery, preferably, the measurement unit measures at least internal resistance of each of the constitutive batteries, and the battery handling method decision unit determines that: the constitutive battery is unreusable when it is determined that the history record information of the constitutive battery is stored in the history record information storage unit and a variation of the quantity of change of the internal resistance is at least a predefined reusability threshold of the variation of the quantity of change of the internal resistance, and the constitutive battery is reusable when it is determined that the history record information of the constitutive battery is stored in the history record information storage unit unless the constitutive battery is determined as unreusable. Accordingly, whether or not the battery is reusable is determined based on the variation of the quantity of change of the internal resistance which is one of indicators used to assess a degree of degradation of the battery.

In the above method of reusing battery, preferably, the measurement unit measures at least internal resistance of each of the constitutive batteries, and the battery handling method decision unit determines that: the constitutive battery is unreusable when it is determined that the history record information of the constitutive battery is stored in the history record information storage unit and a difference between the measured internal resistance and an initial value of the internal resistance is equal to or more than a predefined reusability threshold of the initial value of the internal resistance, and the constitutive battery is reusable when it is determined that the history record information of the constitutive battery is stored in the history record information storage unit unless the constitutive battery is determined as unreusable. Accordingly, whether or not the battery is reusable is determined based on the quantity of change of the internal resistance from its initial value which is one of indicators used to assess a degree of degradation of the battery.

In the above method of reusing battery, preferably, the constitutive battery is a battery cell. Thus, the reusability can be determined per battery cell so that any reusable battery cell is effectively used.

In the above method of reusing battery, preferably, the constitutive battery is a stack having a combination of a plurality of constitutive battery cells. Thus, the reusability can be determined per stack. It takes less processing steps to combine the plural stacks in the form of a battery pack, leading to cost reduction.

Furthermore, another aspect of the invention provides an information communication terminal apparatus including: a terminal transmitter for transmitting information to a battery management apparatus; a terminal controller for requesting the battery management apparatus to decide a method of reusing a battery pack; and a terminal receiver for receiving the information from the battery management apparatus, wherein the battery management apparatus includes: a history record information storage unit for storing therein identification information of a battery pack and measured value data of state information of constitutive batteries included in the battery pack as history record information associated with each other; a history record presence/absence decision unit for determining whether or not the history record information of the battery pack is stored in the history record information storage unit; and a battery handling method decision unit for determining whether or not the constitutive batteries of the battery pack are reusable based on the history record information of the constitutive batteries, wherein the terminal receiver receives a notice notifying of a decision not to use the battery pack determined as unreusable when it is determined that the history record information of the battery pack is not stored in the history record information storage unit, and a notice notifying of a method of reusing the batteries decided by the battery handling method decision unit when it is determined that the history record information of the battery pack is stored in the history record information storage unit. The information communication terminal apparatus is notified of a method of reusing a battery of any battery-mounted equipment thus decided by the battery management apparatus based on the status information of the battery.

Effects of the Invention

According to the invention, there are provided a battery management system, a battery management apparatus, a method of reusing battery, and an information communication terminal apparatus whereby a handling method of a battery retrieved from a battery-mounted equipment, such as a vehicle, can be decided with low cost.

Figure 1:
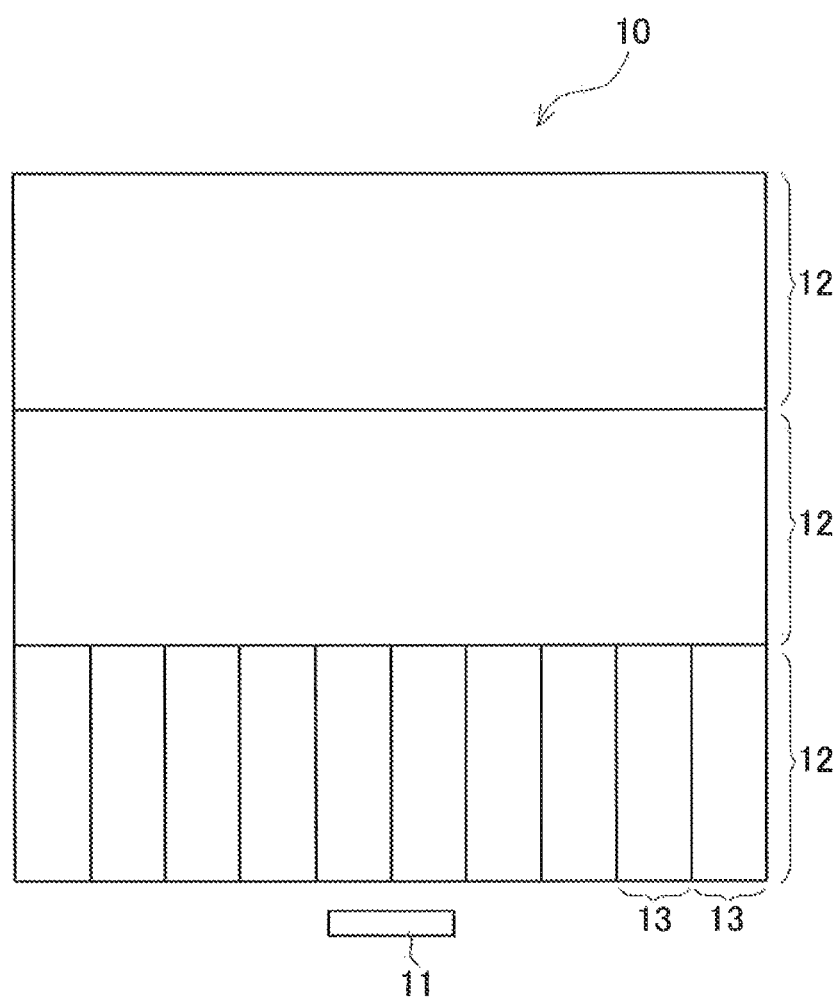
FIG. 1 is a schematic structural view to explain a battery pack in an embodiment.

REFERENCE SIGNS LIST 1, 2, 3 Battery management system
10, 20 Battery pack
11 Tag
12 Stack
13 Battery cell
100, 200 Vehicle
110 Measurement unit
120 Connecting portion
130, 430 Storage unit
140 PLC
150 Other structural elements
220, 320, 420 Transmitter
300 External battery charger
310 Connected portion
330 Charger
400 Battery information acquisition device
410 Connected portion
1000 Data station
1010 Receiver
1020 History record information storage unit
1030 Decision unit
1031 History record presence/absence decision unit
1032 Battery handling method decision unit
2000 Information communication terminal apparatus

MODE FOR CARRYING OUT THE INVENTION

A detailed description of preferred embodiments of the present invention will now be given referring to the accompanying drawings. The following embodiments describe specific examples of a battery management system, a method of reusing battery, and an information communication terminal apparatus for on-vehicle batteries.

Embodiment 1

1. Structure of Battery Pack

As illustrated in FIG. 1, a battery pack 10 described in the present embodiment includes a plurality of stacks 12. FIG. 1 illustrates a battery pack 10 including three stacks 12. The stacks 12 each includes a plurality of battery cells 13. The stacks 12 are each a constitutive battery of the battery pack 10. The stack 12 illustrated at the bottom of FIG. 1 has ten battery cells 13 stacked therein. Though battery cells 13 of the upper two stacks 12 are not illustrated in FIG. 1, these two upper stacks 12 are structured similar to the bottom stack 12.

The stacks are illustrated as an example. The number of the stacks 12 constituting the battery pack 10 and the number of the battery cells 13 provided in each stack 12 are not necessarily limited to those illustrated in the drawing but are arbitrarily decided. The battery pack 10 has a tag 11. The tag 11 is an identification information storage unit where identification information of the battery pack 10, such as serial number, is stored. The identification information storage unit may store therein any other management-related information.

2. Method of Reusing Battery

A method of reusing battery according to the present embodiment decides which of reusing, rebuilding, and recycling is best employed for the battery pack 10.

2-1. Reusing

The reusing is to directly reuse the battery pack 10. For example, assuming that the battery pack 10 of a user's vehicle has been degraded, and another vehicle is no longer of use but equipped with a battery pack 10 still good enough to be reused. In such a case, the degraded battery pack 10 is removed from the user's vehicle, and the reusable battery pack 10 is mounted therein.

2-2. Rebuilding

The rebuilding is to remove any reusable ones of the battery cells 13 and the stacks 12 from the battery pack 10 and to reassemble them anew into a whole battery pack 10. The rebuilding has two options 1 and 2 as described below.

2-2-1. Option 1

According to the option 1, any reusable ones of the stacks 12 are removed from the battery pack 10 of the disused vehicle and then gathered and combined again as a battery pack 10. The option 1 replaces the degraded battery pack 10 of the user's vehicle with the reassembled battery pack 10, in which case the user replaces the whole battery pack 10. Therefore, none of the stacks 12 of the battery pack 10 removed from the user's vehicle is mounted again on his vehicle.

2-2-2. Option 2

According to the option 2, any reusable ones of the stacks 12 of the battery pack 10 mounted on the user's vehicle are reused. The reusable stacks 12 are removed from the battery pack 10 of the user's vehicle and combined with any reusable stacks 12 removed from a disused vehicle to be used as a whole battery pack 10. Therefore, a part of the stacks 12 of the battery pack 10 removed from the user's vehicle constitutes a part of the reassembled battery pack 10. In this option, only non-reusable ones of the stacks 12 are replaced.

Thus, the options 1 and 2 are available, either of which may be employed. To simplify the description, the embodiments 1 to 6 describe examples according to the option 1, while the embodiment 7 describes an example according to the option 2.

2-3. Recycling

The recycling is to scrap the battery pack 10 to recycle as raw materials. The recycled materials are used to produce a brand-new battery pack 10.

To perform the aforementioned method of reusing battery, the battery management system and the battery management apparatus in the present embodiment are configured as described below.

3. Structure of Battery Management System

Figure 2:
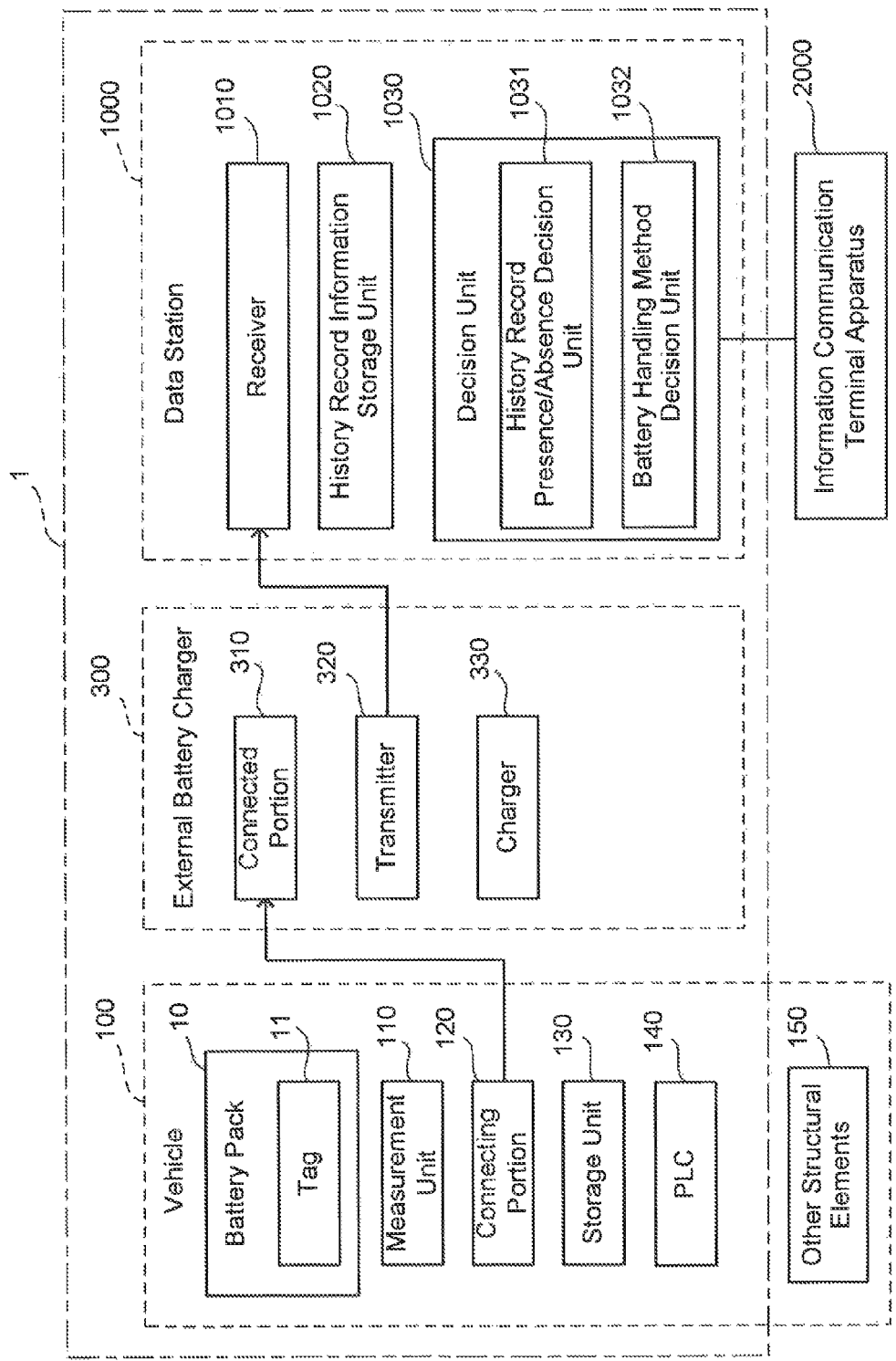
FIG. 2 is a block diagram to explain a battery management system in an embodiment 1.

FIG. 2 is a block diagram illustrating a battery management system 1 for on-vehicle batteries according to the present embodiment. The battery management system 1 is embedded with a part of a vehicle 100, an external battery charger 300, and a data station 1000.

3-1. Vehicle

The vehicle 100 includes a battery pack 10, a measurement unit 110, a connecting portion 120, a storage unit 130, a PLC 140 (Programmable Logic Controller), and other structural elements 150. The vehicle 100 has a power source such as a motor driven by electric power supplied by the battery pack 10. The vehicle 100 is a hybrid car or an electric automobile equipped with the battery pack 10. The other structural elements 150 include the power source, a transmission system, and an operation system. The battery management system 1 doesn't include the other structural elements 150. The battery pack 10 has a tag 11.

The measurement unit 110 is provided to measure a full charge capacity of each stack 12 whenever necessary. The full charge capacity is the status information of the battery used to determine a degree of degradation of each of the stacks 12 constituting the battery pack 10. The connecting portion 120 is connected to the external battery charger 300 when the battery pack 10 is recharged. The connecting portion 120 includes a connection terminal used for recharging the battery pack and a connector used to communicate with the PLC 140 and the external battery charger 300. In a storage unit 130, measured value data of the full charge capacity obtained by the measurement unit 110 is stored with dates and times when the data was measured. The storage unit 130 may store therein other data as well. The PLC 140 is used to communicate with the external battery charger 300 thorough the connecting portion 120. The PLC 140 is not necessarily limited to such a unit as far as it functions as a communication tool. The measurement unit 110 may be provided in the battery pack 10.

3-2. External Battery charger

The external battery charger 300 includes a connected portion 310, a transmitter 320, and a charger 330. The connected portion 310 is connected to the connecting portion 120 of the vehicle 100. The connected portion 310 is provided with a connection terminal used to recharge the battery pack 10 of the vehicle 100, and a connector used to communicate with the vehicle 100. The transmitter 320 transmits the identification information recorded in the tag 11 and measured value data to a receiver 1010 of the data station 1000. The charger 330 recharges the battery pack 10 of the vehicle 100 through the connected portion 310.

The external battery charger 300 may have a storage unit so that the data is temporarily stored in the storage unit and then transmitted with a predefined time lag. When the storage unit is thus used, information of the battery packs 10 of a plurality of vehicles 100 can be transmitted at once.

3-3. Data Station

The data station 1000 is a battery information management unit including a receiver 1010, a history record information storage unit 1020, and a decision unit 1030. The data station 1000 also functions as a battery management apparatus. The receiver 1010 receives the data transmitted from the transmitter 320 of the external battery charger 300. The history record information storage unit 1020 stores therein the data received by the receiver 1010 as history record information. The history record information storage unit 1020 stores therein the history record information of batteries of a plurality of vehicles (measured values of full charge capacity and information of dates and times when the values were measured) and the identification information of the battery packs 10 whose history record information is recorded. The history record information and the identification information are stored in a manner that they associate with each other.

Thus, the identification information of the tag 11 and the history record information are stored in a manner that they associate with each other in the history record information storage unit 1020 of the data station 1000. The history record information storage unit 1020 further stores therein the identification information and the history record information of the battery packs 10 of a large number of vehicles 100. The history record information thus stored in the storage unit includes the history records of the stacks 12 and the battery cells 13 so that all of the history records of the stacks 12 and the battery cells 13 can be traced back from the identification information of the tag 11 of the battery pack 10. For example, such a history record that which of the battery packs 10 included the stack 12 is stored in the history record information storage unit 1020 in a manner that associates with the identification information of the tag 11.

The decision unit 1030 has a history record presence/absence decision unit 1031 and a battery handling method decision unit 1032. The decision unit 1030 determines a degree of degradation of a battery and decides a method of reusing the battery by using the history record presence/absence decision unit 1031 and the battery handling method decision unit 1032. The decision unit 1030 may be responsible for any other matters to be determined or decided. The history record presence/absence decision unit 1031 determines whether or not the history record of the battery pack 10, for which a method of reuse should be decided, is stored in the history record information storage unit 1020 by comparing the identification information of the battery pack 10, for which a method of reuse should be decided, to the identification information of the battery pack 10 stored in the history record information storage unit 1020. The battery handling method decision unit 1032 decides which of the reusing, rebuilding, and recycling should be performed for the battery pack 10 based on the history record of the full charge capacity stored in the history record information storage unit 1020.

The data station 1000 is connected to an information communication terminal apparatus 2000 to notify a method of reuse decided for the battery pack 10 whenever requested by the information communication terminal apparatus 2000.

4. Method of Collecting Battery History Record Information

The measurement unit 110 of the vehicle 100 measures the full charge capacity of the battery pack 10 whenever necessary. The measurement unit 110 measures the full charge capacity by each stack 12, and measured value data thereby obtained is stored in the storage unit 130 with dates and times when the data was measured. The vehicle 100, whenever recharged by the external battery charger 300, communicates with the external battery charger 300 through the connecting portion 120 and connected portion 310. Whenever the battery pack 10 is recharged, the external battery charger 300 obtains the identification information and measured value data of the full charge capacity of the battery pack 10 mounted on the vehicle 100. The external battery charger 300 further obtains information of dates and times when the measured value data was obtained.

The external battery charger 300 transmits the measured value data to the data station 1000. In the data station 1000, the data is received by the receiver 1010 every time when transmitted thereto, and the received data is stored in the history record information storage unit 1020 so that the measured value data of the full charge capacity is stored in the history record information storage unit 1020 in a manner that associates with the identification information of the battery pack 10 stored in the tag 11. Further, dates and times when the data was measured are also stored in the history record information storage unit 1020 of the data station 1000 so that the measured values of the full charge capacity data are chronologically stored.

In the case where the history record of the battery pack 10 is already stored in the history record information storage unit 1020 when the history record information is stored therein, the received full charge capacity data is simply added to the information already stored. In the case where the history record of the battery pack 10 is not yet stored in the history record information storage unit 1020 when the history record is stored therein, the received full charge capacity data is stored as new history record information. Whether or not the history record information is already recorded in the history record information storage unit 1020 is determined depending on whether or not any information consistent with the identification information of the tag 11 is already stored in the history record information storage unit 1020.

The history record information storage unit 1020 of the data station 1000 may store therein all of the received measured values of the full charge capacity. The data station 1000 may decide not to store a part of the received measured values of the full charge capacity. This is because some of the measured value data may not be needed to determine a degree of degradation of the battery pack 10 relatively shortly after the last time when the full charge capacity value was measured and stored. Therefore, the information may be stored at given time intervals, for example, once in every three months.

5. How to Decide Method of Reusing Degraded Battery

Figure 3:
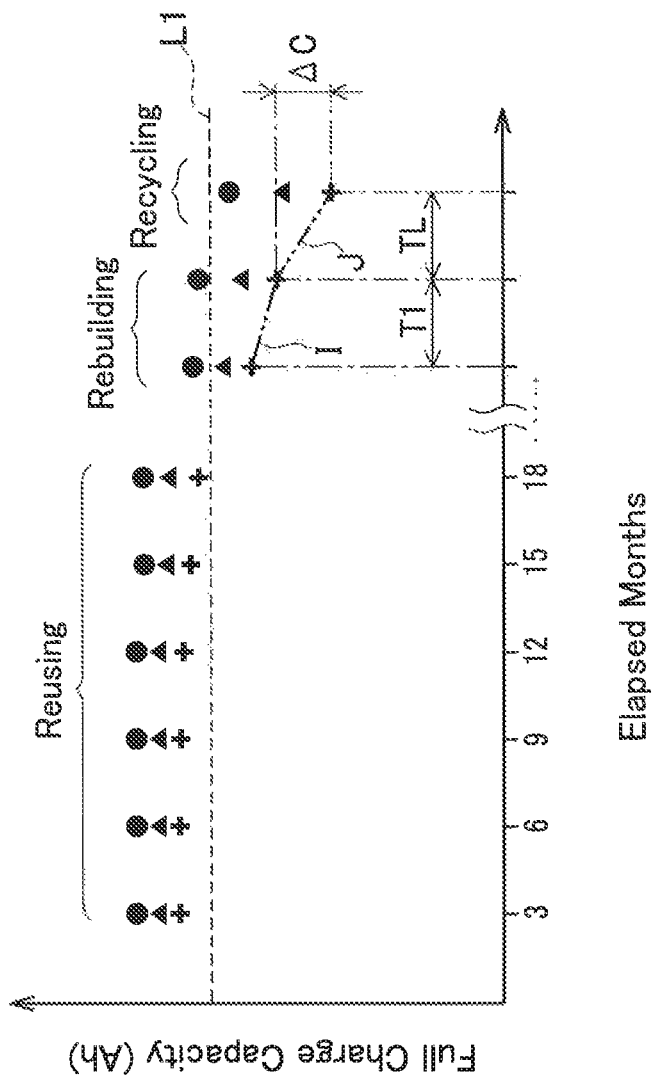
FIG. 3 is a graph to explain a history record of a full charge capacity in the battery management system in the embodiment 1.

As described so far, the information of the battery packs 10 of a large number of vehicles 100 is collected and stored in the data station 1000. The history record information storage unit 1020 stores therein such a history record of the full charge capacity values as illustrated in FIG. 3 by each vehicle, meaning by each battery pack 10. As illustrated in FIG. 3, the measured value of the full charge capacity is stored once in every three months after the battery pack 10 is mounted on the vehicle. However, the measurement intervals are not necessarily limited to every three months or equal intervals.

Referring to FIG. 3, L1 is a reusability threshold of the full charge capacity. Any ones of the stacks 12 having the full charge capacity values equal to or below the reusability threshold of the full charge capacity are determined as unreusable. The other stacks 12 having the full charge capacity values larger than the reusability threshold of the full charge capacity are determined as reusable.

5-1. Reusing

In the case where all of the stacks 12 of the battery pack 10 are reusable, the whole battery pack is reused. More specifically, the battery pack 10 is reused when the full charge capacity values of all of the stacks 12 of the battery pack 10 are larger than the reusability threshold of the full charge capacity. Referring to FIG. 3, any of positions where the full charge capacity values of the stacks 12 are plotted are above the line L1.

5-2. Rebuilding

In the case where a part of the stacks 12 of the battery pack 10 are reusable but any other stacks 12 of the battery pack 10 are unreusable, it is decided that the battery pack 10 is rebuilt. More specifically, the battery pack 10 is rebuilt when the full charge capacity values of a part of the stacks 12 of the battery pack 10 are larger than the reusability threshold of the full charge capacity and the full charge capacity values of any other stacks 12 are equal to or below the reusability threshold of the full charge capacity. Referring to FIG. 3, positions where the full charge capacity values of a part of the stacks 12 are plotted are above the line L1, but a position where the full charge capacity value of the other stack 12 is plotted is below the line L1.

The rebuilding gathers any ones of the stacks 12 having the full charge capacity values plotted at positions above the line L1, meaning any reusable stacks 12, and combines them in the form of a whole battery pack 10, while transferring the other stacks 12 having the full charge capacity values plotted at positions below the line L1, meaning any unreusable stacks 12, to recycling.

5-3. Recycling

In the case where none of the stacks 12 of the battery pack 10 is reusable, the whole battery pack is recycled. More specifically, the battery pack 10 is recycled when the full charge capacity values of all of the stacks 12 of the battery pack 10 are equal to or below the reusability threshold of the full charge capacity. Referring to FIG. 3, any of positions where the full charge capacity values of the stacks 12 are plotted are below the line L1.

In the case where the data station 1000 has no information relating to the battery pack 10, the battery pack 10 is determined as unreusable because it is costly to measure the full charge capacity data of the battery pack 10 not recorded in the data station 1000.

6. Flow of Battery Reusing Method

Figure 4:
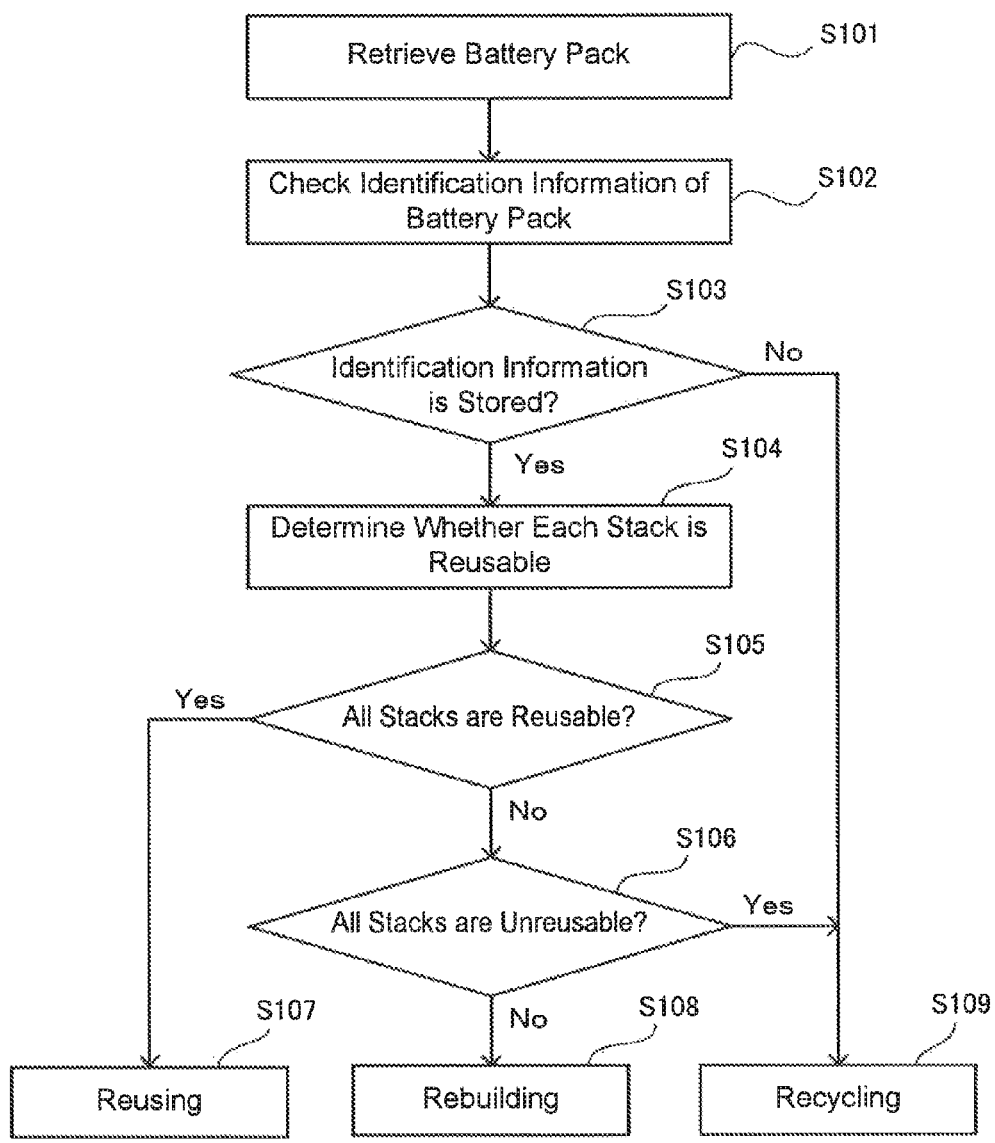
FIG. 4 is a flowchart to explain processing to be executed by the battery management system in the embodiment.

The method of reusing battery for in-vehicle batteries is described referring to a flow chart illustrated in FIG. 4. First, it is decided that the vehicle 100 no longer of use is discarded. The vehicle 100 is disassembled to retrieve the battery pack 10 equipped therein (S101). Next, identification information of the battery is obtained from the tag 11 of the battery pack 10 and checked by referring to the data station 1000 (S102). The identification information check may use software dedicated to such an information check.

It is determined whether or not the information relating to the battery is stored in the history record information storage unit 1020 of the data station 1000 (S103). More specifically, the history record presence/absence decision unit 1031 of the decision unit 1030 checks whether or not the identification information of the battery pack 10 is stored in the history record information storage unit 1020. The flow proceeds to S104 when it is determined in S103 that the information of the battery pack 10 is stored in the history record information storage unit 1020 of the data station 1000 (Yes in S103), while proceeding to S109 when it is determined in S103 that the information of the battery pack 10 is not stored in the history record information storage unit 1020 of the data station 1000 (No in S103).

In S104, the history record information of the stacks 12 of the battery pack 10 is read out to determine whether or not each of the stacks 12 is reusable (S104). The reusability of each stack 12 is determined by the battery handling method decision unit 1032 of the decision unit 1030 in the manner described earlier. Then, the flow proceeds to S105.

The flow proceeds to S107 when it is determined in S105 that all of the stacks 12 of the battery pack 10 are reusable (Yes in S105), more specifically, when the full charge capacity values of the stacks 12 are all larger than the reusability threshold of the full charge capacity. Otherwise (No in S105), the flow proceeds to S106.

The flow proceeds to S109 when it is determined in S106 that none of the stacks 12 of the battery pack 10 is reusable (Yes in S106), more specifically, when the full charge capacity values of the stacks 12 are all equal to or below the reusability threshold of the full charge capacity. The flow proceeds to S108 when it is determined in S106 that the reusable and unreusable stacks 12 are mixedly included in the battery pack 10 (No in S106), more specifically, when the full charge capacity values of a part of the stacks 12 are lager than the reusability threshold of the full charge capacity and the full charge capacity values of other stacks 12 are equal to or below the reusability threshold of the full charge capacity.

It is decided in S107 that the battery pack 10 is reused. Then, the battery pack 10 thus decided is resold to a user to be directly mounted on a different vehicle.

It is decided in S108 that any reusable stacks 12 of the battery pack 10 are selected for rebuilding. A part of the stacks 12 of the battery pack 10 are gathered and reused in a rebuilt battery pack. Any stacks 12 still as good as reusable are used again as a product. The stacks 12 for which rebuilding is decided is combined and used in a battery pack and sold by a dealer in the market. The other unreusable stacks 12 should be recycled.

It is decided in S109 that the battery pack 10 is recycled. The battery pack 10 is scrapped to be recycled by a recycling company.

7. Modified Embodiment 7-1. Decision Criteria for Reusability

According to the embodiment described so far, the reusability threshold of the full charge capacity is used as a decision criterion on whether the battery pack 10 and the stacks 12 are reusable. The decision criterion for the stacks 12, however, is not necessarily limited to the reusability threshold of the full charge capacity. Instead, a quantity of change of the full charge capacity may be employed to determine how degraded the battery pack 10 is.

7-1-1. Quantity of Change of Full Charge Capacity

A quantity of change $\Delta C$ of the full charge capacity can be used as a decision criterion on whether or not the battery pack 10 and the stacks 12 are reusable. As illustrated in FIG. 3, the quantity of change $\Delta C$ is a quantity of change of the full charge capacity during a predefined period of time. The measured value of FIG. 3 most recently stored is compared to the measured value stored nearest before the most recently measured value to calculate a difference therebetween, and the calculated difference is used as the quantity of change of the full charge capacity. When the quantity of change of the full charge capacity is at least a predefined reusability threshold of the quantity of change of the full charge capacity, the relevant stack 12 is determined as unreusable. Otherwise, the stack 12 is determined as reusable.

7-1-2. Variation of Quantity of Change of Full Charge Capacity

Another example of the decision criterion on whether or not the battery pack 10 and the stacks 12 are reusable is a variation of the quantity of change $\Delta C$ of the full charge capacity. A difference between tilts of line segments I and J in FIG. 3 is used as the decision criterion on reusability. When the tilt difference is at least a predefined reusability threshold of the variation of the quantity of change of the full charge capacity, the relevant stack 12 is determined as unreusable. Otherwise, the stack 12 is determined as reusable.

The tilts of the line segments I and J may be expressed as $\Delta C1/T1$, where the quantity of change of the full charge capacity during a period T1 is $\Delta C1$. Further, the tilts may be expressed as $\Delta CL/TL$, where the quantity of change of the full charge capacity during a period TL is $\Delta CL$. A ratio between these tilts $\Delta C1/T1$ and $\Delta CL/TL$ may be obtained and used as the decision criterion on whether or not the battery pack 10 and the stacks 12 are reusable.

7-1-3. Comparison to Initial Value

The reusability of the battery pack 10 and the stacks 12 may be determined by comparing the full charge capacity to its initial value, more specifically, by obtaining a difference between a value of the full charge capacity most recently stored and a value of the full charge capacity initially stored. When the difference between the full charge capacity value most recently stored and the full charge capacity value initially stored is equal to or larger than a reusability threshold of the initial value of the full charge capacity, the relevant stack 12 is determined as unreusable. When the difference between the full charge capacity value most recently stored and the full charge capacity value initially stored is smaller than the reusability threshold of the initial value of the full charge capacity, the relevant stack 12 is determined as reusable. When the reusability is thus determined by simply comparing the full charge capacity to its initial value, it is unnecessary to chronologically store the full charge capacity data.

7-2. Reuse of Each Battery Cell

In the present embodiment, the full charge capacity is measured by each of the stacks 12, however, may be measured by each of the battery cells 13 so that each of the battery cells 13 is determined as reusable or not. Any reusable ones of the battery cells 13 are gathered and used in a rebuilt battery pack, wherein the battery cells 13 are constitutive batteries of the battery pack.

7-3. Battery-Mounted Equipment

In the present embodiment, the battery mounted on the vehicle was described. However, the embodiment is not necessarily limited to vehicles but is further applicable to any electronic devices charged by an external battery charger. Therefore, the method of reusing battery and the battery management system according to the embodiment are basically applicable to any battery-mounted equipments. The battery-mounted equipments are vehicles and other electronic devices equipped with a battery pack. Thus, vehicles are included in the battery-mounted equipments.

7-4. Reuse of Battery Cell per se

In the present embodiment, the vehicle 100 equipped with the battery pack 10 was described. The method of reusing battery and the battery management system according to the present embodiment are applicable to any vehicles and other electronic devices equipped with a single battery cell 13. When the method of reusing battery and the battery management system according to the present embodiment are applied to these devices, one tag 11 is provided in one battery cell 13.

7-5. Storage Site of Identification Information

According to the embodiment, the tag 11 is provided inside of the battery pack 10. However, the tag 11 may be provided anywhere inside of the vehicle 100 other than inside of the battery pack 10 because how to reuse the battery pack 10 is similarly decided based on the history record information of the battery pack 10 as far as the information specific to the vehicle 100 is associated with the battery pack 10.

8. Wrap-Up

As described so far in detail, the battery management system according to the present embodiment transmits the full charge capacity data measured by the measurement unit 110 of the vehicle 100 to the data station 1000 by way of the external battery charger 300. The data station 1000 selects and decides how the battery pack 10 should be reused based on the history record of the full charge capacity values. Thus, the present embodiment accomplishes the battery management system wherein any suitable method of reusing the battery pack 10 is effectively decided.

The method of reusing battery according to the present embodiment, wherein it is unnecessary to retest a degree of degradation of any retrieved battery, can be accomplished with less cost.

The embodiment, which is just an example of the invention, does not necessarily restrict the scope of the invention. The invention may be improved or modified within the scope of its technical idea. For example, the invention is applicable to various types of batteries, including nickel hydride battery, lithium ion battery, and any other batteries.

Embodiment 2

An embodiment 2 is hereinafter described. An overall structure of a battery management system according to the embodiment 2 is almost the same as that of the battery management system 1 according to the embodiment 1. The embodiment 1 measures and uses the full charge capacity to assess a degree of degradation of a battery. The embodiment 2 measures and uses an internal resistance of the battery to assess a degree of degradation of a battery. The internal resistance of the battery is the state information of the battery used to determine a degree of degradation of each of the stacks 12 in the battery pack 10. Any other technical aspects are similar to those of the embodiment 1, therefore, only the differences are hereinafter described.

1. Measurement of Battery Internal Resistance

The present embodiment measures internal resistance values of the battery pack 10. The measurement unit 110 measures the internal resistance by each of the stacks 12 in the battery pack 10, and the measured internal resistance of each stack 12 is stored in the storage unit 130 of the vehicle 100 every time when it is measured. The battery internal resistance can be measured under different conditions.

For example, SOC (State of Charge) and temperature setting may be changed to measure the internal resistance, wherein SOC (25%, 50%) and temperatures (0° C., 10° C., 20° C.) are variously combined. More specifically, the internal resistance is measured in different patterns; pattern 1 (SOC 25%, temperature 0° C.), pattern 2 (SOC 25%, temperature 10° C.), pattern 3 (SOC 25%, temperature 20° C.), pattern 4 (SOC 50%, temperature 0° C.), pattern 5 (SOC 50%, temperature 10° C.), and pattern 6 (SOC 50%, temperature 20° C.).

2. How to Decide Method of Reusing Degraded Battery

Figure 5:
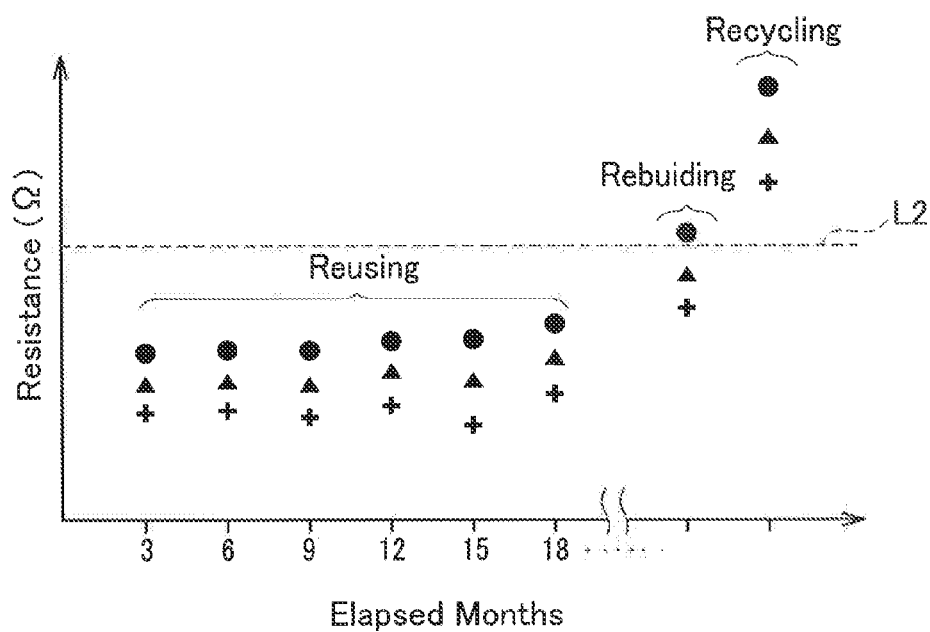
FIG. 5 is a graph to explain a history record of internal resistance of a battery in a battery management system in an embodiment 2.

The information of the battery pack 10 of the vehicle 100 is collected and stored in the data station 1000. The history record information storage unit 1020 stores therein such a history record of the internal resistance values of the battery as illustrated in FIG. 5. The history record information storage unit 1020 stores therein values of the internal resistance of the battery measured once in every three months after the battery pack 10 is installed on the vehicle. However, the measurement intervals are not necessarily limited to every three months or equal intervals.

Referring to FIG. 5, L2 is a reusability threshold of the internal resistance. Any ones of the stacks 12 having the internal resistance values equal to or larger than the reusability threshold of the internal resistance are determined as unreusable. The other ones of the stacks 12 having the internal resistance values smaller than the reusability threshold of the internal resistance are determined as reusable.

When the internal resistance values of all of the stacks 12 in the battery pack 10 are smaller than the reusability threshold of the internal resistance, it is decided that the battery pack 10 is reused. Referring to FIG. 5, it is decided that the battery pack 10 is reused when any of positions where the internal resistance values of the stacks 12 are plotted are below the line L2.

When the internal resistance values of a part of the stacks 12 in the battery pack 10 are smaller than the reusability threshold of the internal resistance and the internal resistance values of other stacks 12 in the battery pack 10 are equal to or larger than the reusability threshold of the internal resistance, it is decided that the battery pack 10 is rebuilt. Referring to FIG. 5, when positions where a part of the internal resistance values of the stacks 12 are plotted are below the line L2, and positions where the internal resistance values of other stacks 12 are plotted are above or as high as the line L2, it is decided that the battery pack 10 is rebuilt. More specifically, the stacks 12 having the internal resistance values plotted at positions below the line L2 are combined and used in a rebuilt battery pack 10, while the stacks 12 having the internal resistance values plotted at positions above or as high as the line L2 are recycled.

When the internal resistance values of all of the stacks 12 in the battery pack 10 are at least the reusability threshold of the internal resistance, it is decided that the battery pack 10 is recycled. Referring to FIG. 5, when the internal resistance values of all of the stacks 12 are plotted at positions above or as high as the line L2, it is decided that the battery pack 10 is recycled.

3. Modified Embodiment

The present embodiment uses the reusability threshold of the internal resistance of the battery as a decision criterion on whether or not the battery pack 10 and the stacks 12 are reusable. Any other technical aspects are similar to those of the embodiment 1. Therefore, the modified embodiment of the embodiment 1 is similarly applied to the embodiment 2.

3-1. Decision Criteria for Reusability

According to the embodiment described so far, the reusability threshold of the internal resistance is used as a decision criterion on whether or not the battery pack 10 and the stacks 12 are reusable. The decision criterion for the stacks 12, however, is not necessarily limited to the reusability threshold of the internal resistance.

3-1-1. Quantity of Change of Internal resistance

Another example of the decision criterion on whether or not the battery pack 10 and the stacks 12 are reusable is a quantity of change of the internal resistance. The quantity of change is a quantity of change of the internal resistance during a predefined period of time. A measured value most recently stored is compared to a measured value stored nearest before the most recently measured value to calculate a difference therebetween, and the calculated difference is used as the quantity of change of the internal resistance. When the quantity of change of the internal resistance is at least a predefined reusability threshold of the quantity of change of the internal resistance, the relevant stack 12 is determined as unreusable. Otherwise, the stack 12 is determined as reusable.

3-1-2. Variation of Quantity of Change of Internal Resistance

Yet another example of the decision criterion on whether or not the battery pack 10 and the stacks 12 are reusable is a variation of the quantity of change of the internal resistance. When the variation of the quantity of change of the internal resistance is at least a predefined reusability threshold of the variation of the quantity of change of the internal resistance, the relevant stack 12 is determined as unreusable. Otherwise, the stack 12 is determined as reusable.

3-1-3. Comparison to Initial Value

The reusability of the battery pack 10 and the stacks 12 may be determined by comparing the internal resistance to its initial value, more specifically, by obtaining a difference between a value of the internal resistance most recently stored and a value of the internal resistance initially stored. When the difference between the internal resistance value most recently stored and the internal resistance value initially stored is at least a threshold of the initial value of the internal resistance, the relevant stack 12 is determined as unreusable. When the difference between the internal resistance value most recently stored and the internal resistance value initially stored is smaller than the reusability threshold of the initial value of the internal resistance, the relevant stack 12 is determined as reusable. When the reusability is thus determined by simply comparing the internal resistance to its initial value, it is unnecessary to chronologically store the internal resistance data.

3-2. Reuse of Each Battery Cell

In the present embodiment, the internal resistance is measured by each of the stacks 12, however, may be measured by each of the battery cells 13 so that each of the battery cells 13 is determined as reusable or not. Any reusable ones of the battery cells 13 are gathered and used in a rebuilt battery pack, wherein the battery cells 13 are constitutive batteries of the battery pack.

3-3. Battery-Mounted Equipment

In the present embodiment, the battery mounted on the vehicle was described. However, the embodiment is not necessarily limited to vehicles but is further applicable to any electronic devices charged by an external battery charger. Therefore, the method of reusing battery and the battery management system according to the present embodiment are basically applicable to any battery-mounted equipments.

3-4. Reuse of Battery Cell per se

In the present embodiment, the vehicle 100 equipped with the battery pack 10 was described. The method of reusing battery and the battery management system according to the embodiment are applicable to any vehicles and other electronic devices equipped with a single battery cell 13. When the method of reusing battery and the battery management system according to the embodiment are applied to these devices, one tag 11 is provided in one battery cell 13.

3-5. Storage Site of Identification Information

According to the embodiment, the tag 11 is provided inside of the battery pack 10. However, the tag 11 may be provided anywhere inside of the vehicle 100 other than inside of the battery pack 10 because how to reuse the battery pack 10 is similarly decided based on the history record information of the battery pack 10 as far as the information specific to the vehicle 100 is associated with the battery pack 10.

4. Wrap-Up

As described so far in detail, the battery management system according to the embodiment transmits the internal resistance data of the battery measured by the measurement unit 110 of the vehicle 100 to the data station 1000 by way of the external battery charger 300. The data station 1000 selects and decides how the battery pack 10 should be reused based on the history record of the internal resistance values. Thus, the present embodiment accomplishes the battery management system wherein any suitable method of reusing the battery pack 10 is effectively decided.

The method of reusing battery according to the embodiment, wherein it is unnecessary to retest a degree of degradation of any retrieved battery, can be accomplished with less cost.

The embodiment, which is just an example of the invention, does not necessarily restrict the scope of the invention. The invention may be improved or modified within the scope of its technical idea. For example, the invention is applicable to various types of batteries, including nickel hydride battery, lithium ion battery, and any other batteries.

Embodiment 3

An embodiment 3 is hereinafter described. An overall structure of a battery management system according to the embodiment 3 is almost the same as that of the battery management system according to the embodiment 1. The embodiment 1 measures and uses the full charge capacity to assess a degree of degradation of a battery. In place of measuring the full charge capacity, the embodiment 3 measures and uses an upper-limit voltage exceeding count to assess a degree of degradation of a battery. The upper-limit voltage exceeding count is the state information of the battery to determine a degree of degradation of each of the stacks 12 in the battery pack 10. Any other technical aspects are similar to those of the embodiment 1, therefore, only the differences are hereinafter described.

1. Upper-Limit Voltage Exceeding Count

The present embodiment counts how many times the upper-limit voltage of the battery pack 10 was exceeded. The upper-limit voltage is preset as a voltage level desirably not to be exceeded in use of the battery pack 10. The upper-limit voltage exceeding count is number of times when the upper-limit voltage was exceeded. The upper-limit voltage exceeding count is possibly exceeded in such an incident that tires of a vehicle lose grip, for example, when the vehicle is reducing speed on a slick icy road and then regain grip of the road. The measurement unit 110 increments the upper-limit voltage exceeding count of each stack 12 when such an incident occurs and stores the count in the storage unit 130. The measurement unit 110 according to the present embodiment counts number of times when the upper-limit voltage is exceeded by the battery pack 10 in use once in three months or less.

2. How to Decide Method of Reusing Degraded Battery

Figure 6:
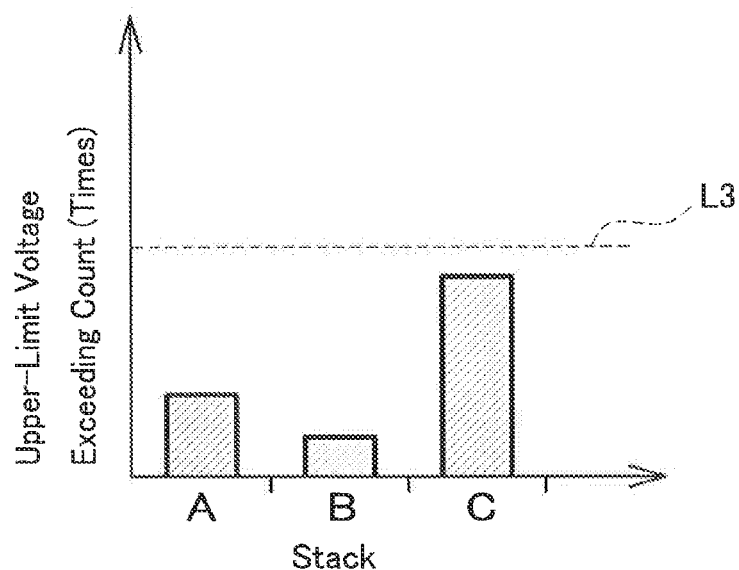
FIG. 6 is a graph to explain a history record of upper-limit voltage exceeding count values in a battery management system in an embodiment 3.

The information of the battery pack 10 of the vehicles 100 is collected and stored in the data station 1000. The history record information storage unit 1020 stores therein such a history record of the upper-limit voltage exceeding count values as illustrated in FIG. 6. The counted value of the upper-limit voltage exceeding count is stored once in every three months after the battery pack 10 is installed on the vehicle. The storing interval is, however, just an example, and the upper-limit voltage exceeding count may be stored at different time intervals.

Referring to FIG. 6, L3 is a reusability threshold of the upper-limit voltage exceeding count. Any ones of the stacks 12 having the upper-limit voltage exceeding count values equal to or larger than the reusability threshold of the upper-limit voltage exceeding count are determined as unreusable, whereas the other stacks 12 having the upper-limit voltage exceeding count values smaller than the reusability threshold of the upper-limit voltage exceeding count are determined as reusable.

When the upper-limit voltage exceeding count values of all of the stacks 12 in the battery pack 10 are smaller than the reusability threshold of the upper-limit voltage exceeding count, it is decided that the battery pack 10 is reused. Referring to FIG. 6, when the upper-limit voltage exceeding count values of all of the stacks 12 in the battery pack 10 are plotted at positions below the line L3, it is decided that the battery pack 10 is reused.

When the upper-limit voltage exceeding count values of a part of the stacks 12 in the battery pack 10 are smaller than the reusability threshold of the upper-limit voltage exceeding count but the upper-limit voltage exceeding count values of other stacks 12 in the battery pack 10 are at least the reusability threshold of the upper-limit voltage exceeding count, it is decided that the battery pack 10 is rebuilt. Referring to FIG. 6, when positions at which the upper-limit voltage exceeding counts values of a part of the stacks 12 are plotted are below the line L3, and positions at which the upper-limit voltage exceeding count values of other stacks 12 are plotted are above the line L3, it is decided that the battery pack 10 is rebuilt. Stacks 12 having the upper-limit voltage exceeding count values plotted at positions below the line L3 are combined and used in a rebuilt battery pack 10, while the other stacks 12 having the upper-limit voltage exceeding counts plotted at positions above or as high as the line L3 are recycled.

When the upper-limit voltage exceeding count values of all of the stacks 12 in the battery pack 10 are equal to or larger than the reusability threshold of the upper-limit voltage exceeding count, it is decided that the battery pack 10 is recycled. Referring to FIG. 6, when positions at which the upper-limit voltage exceeding count values of all of the stacks 12 are plotted are above or as high as the line L3, the relevant battery pack 10 is recycled.

3. Modified Embodiment

The embodiment uses the upper-limit voltage exceeding count as a decision criterion on whether or not the battery pack 10 and the stacks 12 are reusable. Any other technical aspects are similar to those of the embodiment 1. Therefore, a number of technical suggestions in the modified embodiment of the embodiment 1 are similarly applied to the embodiment 3.

3-1. Decision Criteria for Reusability

According to the embodiment described so far, the reusability threshold of the upper-limit voltage exceeding count is used as a decision criterion on whether or not the battery pack 10 and the stacks 12 are reusable. The decision criterion for the stacks 12, however, is not necessarily limited to the reusability threshold of the upper-limit voltage exceeding count. Another example of the decision criterion is a reusability threshold of upper-limit voltage exceeding counts accumulated since the battery pack 10 was produced.

3-2. Reuse of Each Battery Cell

According to the embodiment, the upper-limit voltage exceeding count is counted by each of the stacks 12, however, may be counted by each of the battery cells 13 so that each of the battery cells 13 is determined as reusable or not. Any reusable ones of the battery cells 13 are gathered and used in a rebuilt battery pack, wherein the battery cells 13 are constitutive batteries of the battery pack.

3-3. Battery-Mounted Equipment

In the embodiment, the battery mounted on the vehicle was described. However, the embodiment is not necessarily limited to vehicles but is further applicable to any electronic devices charged by an external battery charger. Therefore, the method of reusing battery and the battery management system according to the embodiment are basically applicable to any battery-mounted equipments.

3-4. Reuse of Battery Cell per se

In the embodiment, the vehicle 100 equipped with the battery pack 10 was described. The method of reusing battery and the battery management system according to the embodiment are applicable to any vehicles and other electronic devices equipped with a single battery cell 13. When the method of reusing battery and the battery management system according to the embodiment are applied to these devices, one tag 11 is provided in one battery cell 13.

3-5. Storage Site of Identification Information

According to the embodiment, the tag 11 is provided inside of the battery pack 10. However, the tag 11 may be provided anywhere inside of the vehicle 100 other than inside of the battery pack 10 because how to reuse the battery pack 10 is similarly decided based on the history record information of the battery pack 10 as far as the information specific to the vehicle 100 is associated with the battery pack 10.

4. Wrap-Up

As described so far in detail, the battery management system according to the embodiment transmits the upper-limit voltage exceeding count data acquired by the measurement unit 110 of the vehicle 100 to the data station 1000 by way of the external battery charger 300. The data station 1000 selects and decides how the battery pack 10 should be reused based on the history record of the upper-limit voltage exceeding count values. Thus, the present embodiment accomplishes the battery management system wherein any suitable method of reusing the battery pack 10 is effectively decided.

The method of reusing battery according to the embodiment, wherein it is unnecessary to retest a degree of degradation of any retrieved battery, can be accomplished with less cost.

The embodiment, which is just an example of the invention, does not necessarily restrict the scope of the invention. The invention may be improved or modified within the scope of its technical idea. For example, the invention is applicable to various types of batteries, including nickel hydride battery, lithium ion battery, and any other batteries.

Embodiment 4

An embodiment 4 is hereinafter described. In this embodiment, the full charge capacity measured in the embodiment 1, the battery internal resistance measured in the embodiment 2, and the upper-limit voltage exceeding count used in the embodiment 3 are combined and used to assess a degree of battery degradation. Any other technical aspects are similar to those of the embodiment 1, therefore, only the differences are hereinafter described.

1. Decision Criteria for Reusability

To determine the reusability, the embodiment 4 collects all of the reusability-related data; full charge capacity, battery internal resistance, and upper-limit voltage exceeding count and decides that a battery is unreusable when any of the full charge capacity, battery internal resistance, and upper-limit voltage exceeding count fails to stay in the proper numeral range, while deciding that the battery is reusable when all of the full charge capacity, battery internal resistance, and upper-limit voltage exceeding count stay in the respective proper numeral ranges. To be determined as reusable, the battery needs to meet all of the requirements of the full charge capacity, battery internal resistance, and upper-limit voltage exceeding count.

2. How to Decide Method of Reusing Degraded Battery

The information of the battery pack 10 of the vehicle 100 is collected and stored in the data station 1000. The history record information storage unit 1020 stores therein such a history record of the full charge capacity values as illustrated in FIG. 3, such a history record of the internal resistance values of the battery as illustrated in FIG. 5, and such a history record of the upper-limit voltage exceeding count values as illustrated in FIG. 6. The values of the full charge capacity, battery internal resistance, and upper-limit voltage exceeding count are acquired and stored once in every three months after the battery pack 10 is mounted on the vehicle. The measurement interval is, however, just an example, and these values may be acquired at different time intervals.

When all of the stacks 12 in the battery pack 10 are determined as reusable, it is decided that the battery pack 10 is reused. In all of the stacks 12 thus determined as reusable, the full charge capacity values thereof are larger than the reusability threshold of the full charge capacity (L1), the internal resistance values thereof are smaller than the reusability threshold (L2) of the internal resistance, and the upper-limit voltage exceeding count values thereof are smaller than the reusability threshold (L3) of the upper-limit voltage exceeding count.

When a part of the stacks 12 in the battery pack 10 are determined as reusable but other stacks 12 are determined as unreusable, it is decided that the battery pack 10 is rebuilt. In a part of the stacks 12, the full charge capacity values thereof are larger than the reusability threshold of the full charge capacity (L1), the internal resistance values thereof are smaller than the reusability threshold (L2) of the internal resistance, and the upper-limit voltage exceeding count values thereof are smaller than the reusability threshold (L3) of the upper-limit voltage exceeding count. Other stacks 12, on the other hand, meet at least one of the conditions, more specifically, the full charge capacity values thereof are equal to or lower than the reusability threshold of the full charge capacity (L1), the internal resistance values thereof are equal to or larger than the reusability threshold (L2) of the internal resistance, or the upper-limit voltage exceeding count values thereof are equal to or larger than the reusability threshold (L3) of the upper-limit voltage exceeding count. When it is decided that the battery pack 10 is rebuilt, reusable ones of the stack 12 are combined and used in a rebuilt battery pack 10, while the other unreusable stacks 12 are recycled.

When all of the stacks 12 in the battery pack 10 are determined as unreusable, it is decided that the battery pack 10 is recycled. All of the stacks 12 of the battery pack 10 meet at least one of the conditions, more specifically, the full charge capacity values thereof are equal to or lower than the reusability threshold of the full charge capacity (L1), the internal resistance values thereof are equal to or larger than the reusability threshold (L2) of the internal resistance, or the upper-limit voltage exceeding count values thereof are equal to or larger than the reusability threshold (L3) of the upper-limit voltage exceeding count.

The thresholds set in the embodiment 4 are not necessarily equal to the respective threshold values set in the embodiments 1 to 3.

3. Modified Embodiment

The present embodiment combines all of the decision criteria; full charge capacity, battery internal resistance, and upper-limit voltage exceeding count to determine whether or not the battery pack 10 and the stacks 12 are reusable. Any other technical aspects are similar to those of the embodiments 1 to 3. Therefore, a number of technical suggestions in the modified embodiment of the embodiments 1 to 3 are similarly applied to the present embodiment.

3-1. Combination of Decision Criteria

The present embodiment used three factors; full charge capacity, battery internal resistance, and upper-limit voltage exceeding count, as decision criteria for selecting a method of reuse, however, may pick two arbitrary ones of these factors as decision criteria, because the reusability of the stacks 12 may be determined in such a manner as described above.

3-2. Decision Criteria for Reusability

There are other options for the decision criteria on whether or not the battery pack 10 and the stacks 12 are reusable. The reusability of the stacks 12 may be determined based on quantities of change of the full charge capacity and the internal resistance or variations of the quantities of change or by comparing the currently acquired values to initial values. The upper-limit voltage exceeding count may be an accumulated value of the upper-limit voltage exceeding count values.

Of the thresholds, at least one of them may be arbitrarily selected. It is decided that stacks 12 determined as unreusable based on at least one of the selected thresholds are unreusable. It is decided that stacks 12 not determined unreusable based on any of the thresholds are reusable. More specifically, stacks 12 other than stacks 12 determined as unreusable are determined as reusable.

3-3. Reuse of Each Battery Cell

In the present embodiment, the full charge capacity, internal resistance, and upper-limit voltage count are acquired by each of the stacks 12, however, may be acquired by each of the battery cells 13 so that each of the battery cells 13 is determined as reusable or not. Reusable ones of the battery cells 13 are gathered and used in a rebuilt battery pack, wherein the battery cells 13 are constitutive batteries of the battery pack.

3-4. Battery-Mounted Equipment

In the embodiment, the battery mounted on the vehicle was described. However, the embodiment is not necessarily limited to vehicles but is further applicable to any electronic devices charged by an external battery charger. Therefore, the method of reusing battery and the battery management system according to the embodiment are basically applicable to any battery-mounted equipments.

3-5. Reuse of Battery Cell per se

In the embodiment, the vehicle 100 equipped with the battery pack 10 was described. The method of reusing battery and the battery management system according to the embodiment are applicable to any vehicles and other electronic devices equipped with a single battery cell 13. When the method of reusing battery and the battery management system according to the embodiment are applied to these devices, one tag 11 is provided in one battery cell 13.

3-6. Storage Site of Identification Information

According to the embodiment, the tag 11 is provided inside of the battery pack 10. However, the tag 11 may be provided anywhere inside of the vehicle 100 other than inside of the battery pack 10 because how to reuse the battery pack 10 is similarly decided based on the history record information of the battery pack 10 as far as the information specific to the vehicle 100 is associated with the battery pack 10.

4. Wrap-Up

As described so far in detail, the battery management system according to the embodiment transmits all of the decision criteria data acquired by the measurement unit 110 of the vehicle 100; full charge capacity, internal resistance of the battery, and upper-limit voltage exceeding count, to the data station 1000 by way of the external battery charger 300. The data station 1000 selects and decides how the battery pack 10 should be reused based on the history records of the full charge capacity, battery internal resistance, and upper-limit voltage exceeding count. Thus, the present embodiment accomplishes the battery management system wherein any suitable method of reusing the battery pack 10 is effectively decided.

The method of reusing battery according to the present embodiment, wherein it is unnecessary to retest a degree of degradation of any retrieved battery, can be accomplished with less cost.

The embodiment, which is just an example of the invention, does not necessarily restrict the scope of the invention. The invention may be improved or modified within the scope of its technical idea. For example, the invention is applicable to various types of batteries, including nickel hydride battery, lithium ion battery, and any other batteries.

Embodiment 5

An embodiment 5 is hereinafter described. In this embodiment, a data transmission route to the data station 1000 is different from those in the embodiments 1 to 4. A description hereinafter given focuses on the difference.

1. Structure of Battery Management System

Figure 7:
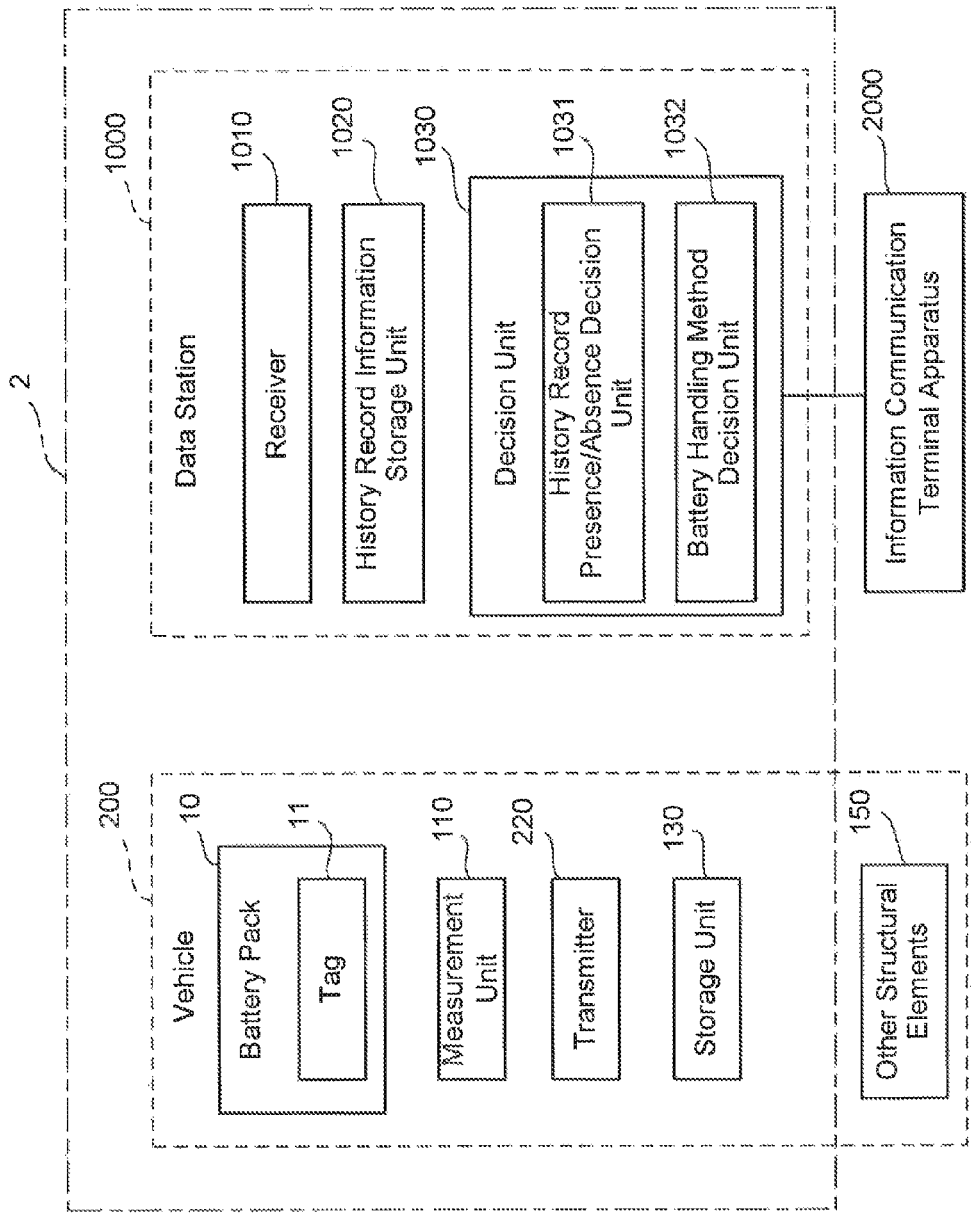
FIG. 7 is a block diagram to explain a battery management system in an embodiment 5.

FIG. 7 illustrates a battery management system 2 according to the present embodiment. As illustrated in FIG. 7, a battery management system 2 is embedded with a part of a vehicle 200 and the data station 1000. In the present embodiment, the external battery charger 300 is not used to communicate the measured value data as shown in FIG. 2, therefore, the PLC 140 is not used either to communicate the measured value data.

The vehicle 200 has a transmitter 220 in addition to the battery pack 10, measurement unit 110, storage unit 130, and other structural elements 150. The transmitter 220 is provided to transmit data to the receiver 1010 of the data station 1000. Because the transmitter 220 is provided, data of the battery pack 10 acquired in the vehicle 200 can always be transmitted to the data station 1000 as long as the main switch is turned on.

2. Method of Collecting History Record Information of Battery

The transmitter 220 can transmit the identification information of the tag 11 and the values acquired by the measurement unit 110 to the data station 1000 at any time. The transmitter 220 may transmit the acquired values stored in the storage unit 130 to the data station 1000 once in every three months, in which case, the data is acquired by the measurement unit 110 once in every three months or acquired at any time and stored.

3. How to Decide Method of Reusing Degraded Battery

The reusability of the stacks 12 may be determined as described in any of the embodiments 1 to 4, and the battery handling method decision unit 1032 of the decision unit 1030 provided in the data station 1000 is responsible for determining the reusability in a manner similar to the other embodiments described so far.

4. Modified Embodiment

The present embodiment uses the decision criteria described in the embodiments 1 to 4 to determine whether or not the battery pack 10 and the stacks 12 are reusable. Therefore, all of the modified embodiments of the embodiments 1 to 4 are similarly applicable to the present embodiment.

4-1 Combination of Decision Criteria

In the present embodiment, at least one of or at most three of the full charge capacity, battery internal resistance, and upper-limit voltage exceeding count may be arbitrarily selected and combined. Regardless of how these decision criteria are combined, the reusability of the stacks 12 can be similarly determined.

4-2. Decision Criteria for Reusability

There are other options for the decision criteria on whether or not the battery pack 10 and the stacks 12 are reusable. The reusability of the stacks 12 may be determined based on the full charge capacity and the internal resistance, quantities of change of the full charge capacity and the internal resistance or variations of the quantities of change or by comparing the currently measured values to initial values. The upper-limit voltage exceeding count may be an accumulated value of the upper-limit voltage exceeding count values.

4-3. Reuse of Each Battery Cell

In the present embodiment, the full charge capacity, battery internal resistance, and upper-limit voltage exceeding count are acquired by each of the stacks 12, however, may be acquired by each of the battery cells 13 so that each of the battery cells 13 is determined as reusable or not. Reusable ones of the battery cells 13 are gathered and used in a rebuilt battery pack, wherein the battery cells 13 are constitutive batteries of the battery pack.

4-4. Battery-Mounted Equipment

In the embodiment, the battery mounted on the vehicle was described. However, the embodiment is not necessarily limited to vehicles but is further applicable to any electronic devices. Therefore, the method of reusing battery and the battery management system according to the embodiment are basically applicable to any battery-mounted equipments.

4-5. Reuse of Battery Cell per se

In the embodiment, the vehicle 200 equipped with the battery pack 10 was described. The method of reusing battery and the battery management system according to the embodiment are applicable to any vehicles and other electronic devices equipped with a single battery cell 13. When the method of reusing battery and the battery management system according to the embodiment are applied to these devices, one tag 11 is provided in one battery cell 13.

4-6. Storage Site of Identification Information

According to the embodiment, the tag 11 is provided inside of the battery pack 10.

However, the tag 11 may be provided anywhere inside of the vehicle 200 other than inside of the battery pack 10 because how to reuse the battery pack 10 is similarly decided based on the history record information of the battery pack 10 as far as the information specific to the vehicle 200 is associated with the battery pack 10.

5. Wrap-Up

As described so far in detail, the battery management system according to the embodiment transmits all of the decision criteria data acquired by the measurement unit 110 of the vehicle 200; full charge capacity, battery internal resistance, and upper-limit voltage exceeding count, directly to the data station 1000 without going via the external battery charger 300. The data station 1000 selects and decides how the battery pack 10 should be reused based on the history records of the full charge capacity values, battery internal resistance values, and upper-limit voltage exceeding count values. Thus, the present embodiment accomplishes the battery management system wherein any suitable method of reusing the battery pack 10 is effectively decided.

The method of reusing battery according to the present embodiment, wherein it is unnecessary to retest a degree of degradation of any retrieved battery, can be accomplished with less cost.

The embodiment, which is just an example of the invention, does not necessarily restrict the scope of the invention. The invention may be improved or modified within the scope of the invention. For example, the invention is applicable to various types of batteries, including nickel hydride battery, lithium ion battery, and any other batteries.

The present embodiment described so far the battery-equipped vehicle, however, is not necessarily limited to vehicles. The present embodiment is similarly applicable to any electronic devices equipped with secondary batteries.

Embodiment 6

An embodiment 6 is hereinafter described. A battery management system 1 according to the present embodiment is provided with a battery information acquisition device in place of the external battery charger 300 of the battery management system 1 shown in FIG. 2.

1. Structure of Battery Management System

Figure 8:
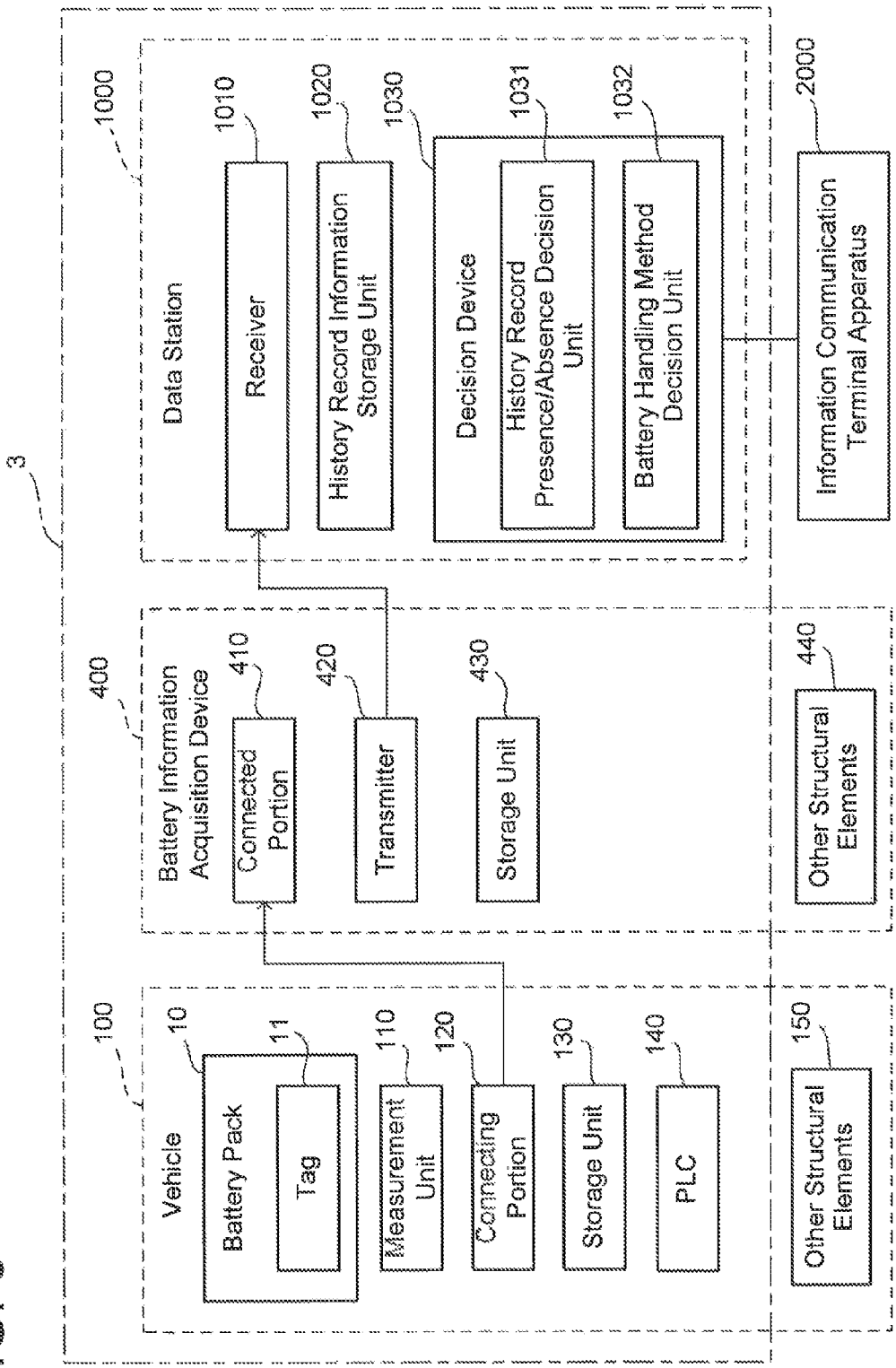
FIG. 8 is a block diagram to explain a battery management system in an embodiment 6.

FIG. 8 is a block diagram of a battery management system 3 for in-vehicle batteries according to the present embodiment. The battery management system 3 is embedded with a part of the vehicle 100, a part of a battery information acquisition device 400, and the data station 1000. The battery information acquisition device 400 acquires information of the battery pack 10. The battery information acquisition device 400 may be a diagnostic device which acquires other information of the vehicle to diagnose mechanical failures, if any, of the vehicle.

The battery information acquisition device 400 has a connected portion 410, a transmitter 420, and a storage unit 430. The connected portion 410 is connected to the connecting portion 120 of the vehicle 100. The connected portion 410 is provided with a connector used to communicate with the vehicle 100. The transmitter 420 transmits the identification information and the measured value data of the battery pack 10 stored in the storage unit 430 to the receiver 1010 of the data station 1000. The storage unit 430 is used as a temporary storage of the identification information and the measured value data of the battery pack 10. The other structural elements 440 obtain information of the structural elements of the vehicle 100 other than the battery pack 10.

The battery information acquisition device 400 acquires the identification information and the measured value data of the battery pack 10. At the time, the battery information acquisition device 400 may further acquire other information of the vehicle 100. The information described so far is acquired through connections provided between the connecting portion 120 of the vehicle 100 and the connected portion 410 of the battery information acquisition device 400.

The information thus obtained is stored in the storage unit 430. Then, the identification information and the measured value data of the battery pack 10 are transmitted to the data station 1000. This data transmission is performed wirelessly.

2. Method of Collecting History Record Information of Battery

The transmitter 420 transmits the measured value data stored in the storage unit 430 to the data station 1000. The transmitter 420 may transmit the measured value data to the data station 1000 at given time intervals, for example, once in every three months.

3. How to Decide Method of Reusing Degraded Battery

The reusability of the stacks 12 may be determined as described in any of the embodiments 1 to 5, and the battery handling method decision unit 1032 of the decision unit 1030 provided in the data station 1000 is responsible for determining the reusability in a manner similar to the other embodiments described so far.

4. Modified Embodiment

The present embodiment uses the decision criteria described in the embodiments 1 to 5 to determine whether or not the battery pack 10 and the stacks 12 are reusable. Therefore, all of the modified embodiments of the embodiments 1 to 5 are similarly applicable to the present embodiment.

4-1 Combination of Decision Criteria

In the present embodiment, at least one or at most three of the full charge capacity, battery internal resistance, and upper-limit voltage exceeding count may be arbitrarily selected and combined as decision criteria on whether or not the stacks 12 are reusable. Any combinations of these decision criteria are similarly useful for determining the reusability of the stacks 12.

4-2. Decision Criteria for Reusability

There are other options for the decision criteria on whether or not the stacks 12 are reusable. The reusability of the stacks 12 may be determined based on the full charge capacity and the internal resistance, quantities of change of the full charge capacity and the internal resistance or variations of the quantities of change or by comparing the currently measured values to initial values. The upper-limit voltage exceeding count may be an accumulated value of the upper-limit voltage exceeding count values.

4-3. Reuse of Each Battery Cell

The embodiment acquires the full charge capacity, internal resistance, and upper-limit voltage exceeding count by each of the stacks 12, however, may be acquired by each of the battery cells 13 so that each of the battery cells 13 is determined as reusable or not. Reusable ones of the battery cells 13 are gathered and used in a rebuilt battery pack, wherein the battery cells 13 are constitutive batteries of the battery pack.

4-4. Battery-Mounted Equipment

In the embodiment, the battery mounted on the vehicle was described. However, the embodiment is not necessarily limited to vehicles but is further applicable to any electronic devices. Therefore, the method of reusing battery and the battery management system according to the embodiment are generally applicable to any battery-mounted equipments.

4-5. Reuse of Battery Cell per se

In the embodiment, the vehicle 100 equipped with the battery pack 10 was described. The method of reusing battery and the battery management system according to the embodiment are applicable to any vehicles and other electronic devices equipped with a single battery cell 13. When the method of reusing battery and the battery management system according to the embodiment are applied to these devices, one tag 11 is provided in one battery cell 13.

4-6. Storage Site of Identification Information

According to the embodiment, the tag 11 is provided inside of the battery pack 10. However, the tag 11 may be provided anywhere inside of the vehicle 100 other than inside of the battery pack 10 because how to reuse the battery pack 10 is similarly decided based on the history record information of the battery pack 10 as far as the information specific to the vehicle 100 is associated with the battery pack 10.

4-7. Cable Communication

In the present embodiment, the information is wirelessly transmitted from the transmitter 420 of the battery information acquisition device 400 to the data station 1000, however, cable communication may be employed. A similar effect is accomplished when the information is transmitted through wires.

5. Wrap-Up

As described so far in detail, the battery management system 3 according to the present embodiment transmits all of the decision criteria data acquired by the measurement unit 110 of the vehicle 100; full charge capacity, battery internal resistance, and upper-limit voltage exceeding count, to the data station 1000 by way of the battery information acquisition device 400. Then, the data station 1000 selects and decides a suitable method of reusing the battery pack 10 based on the history records of the full charge capacity, battery internal resistance, and upper-limit voltage exceeding count. Thus, the present embodiment provides the battery management system wherein any suitable method of reusing the battery pack 10 is effectively decided.

The method of reusing battery according to the embodiment, wherein it is unnecessary to retest a degree of degradation of any retrieved battery, can be accomplished with less cost.

The embodiment, which is just an example of the invention, does not necessarily restrict the scope of the invention. The invention may be improved or modified within the scope of its technical idea. For example, the invention is applicable to various types of batteries, including nickel hydride battery, lithium ion battery, and any other batteries.

The present embodiment described so far the battery-equipped vehicle, however, is not necessarily limited to vehicles. The present embodiment is similarly applicable to any electronic devices equipped with secondary batteries.

As described so far in the embodiments 1 to 6, either of cable transmission or wireless transmission is chosen to transmit the values acquired in the vehicle. The transmission manner is not particularly limited as far as the acquired value data is finally transmitted to the data station 1000. Whichever the transmission manner may be employed, the data station 1000 can similarly determine a degree of degradation of the battery and decide a suitable method of reusing the battery.

Embodiment 7

An embodiment 7 is hereinafter described. The present embodiment adopts the option 2 for rebuilding. According to the option 2, any reusable ones of stacks in a battery pack loaded in a user's vehicle are reused. Reusable ones of the stacks in the battery pack mounted on the user's vehicle and reusable ones of stacks in another battery pack are combined and used in a rebuilt battery pack. Then, the rebuilt battery pack is mounted on the user's vehicle.

1. Structure of Battery Pack

Figure 9:
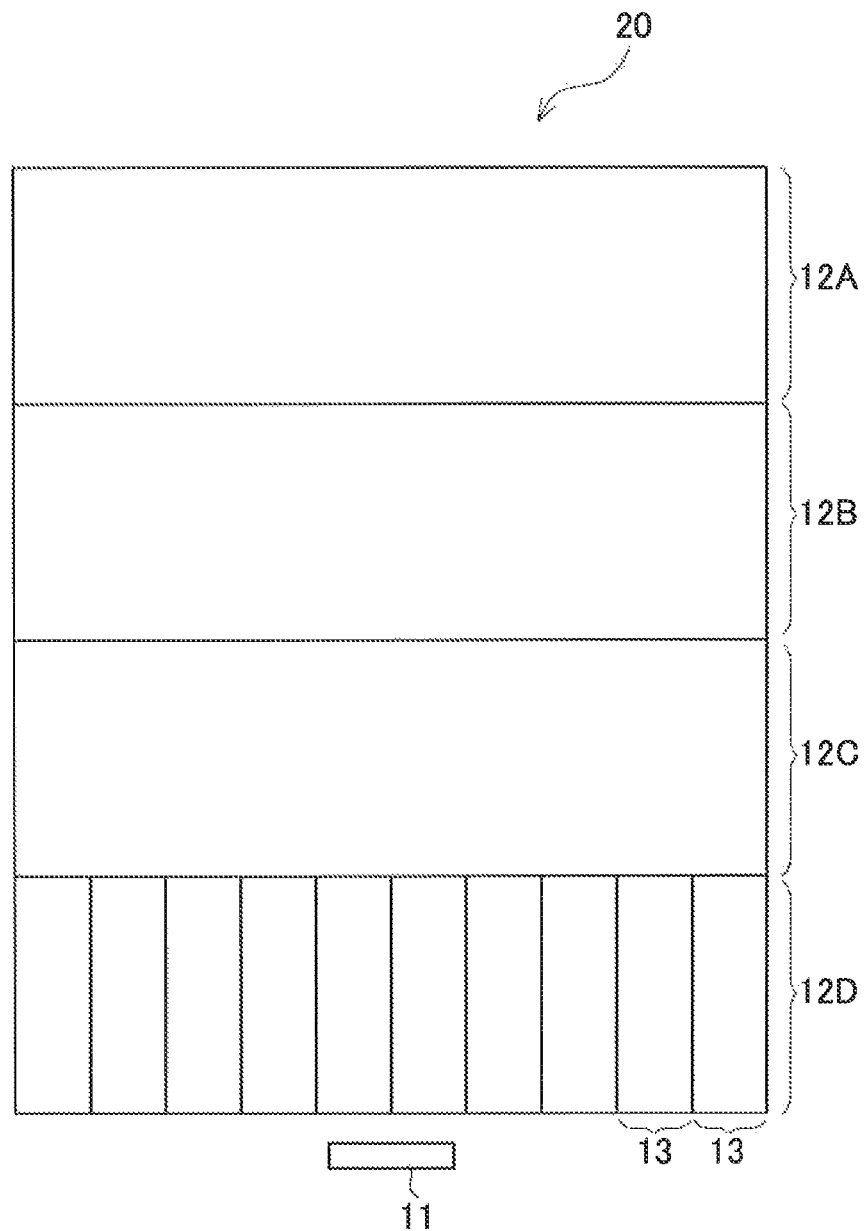
FIG. 9 is a schematic structural view to explain a battery pack in an embodiment 7.

In the present embodiment, the user's vehicle is equipped with such a battery pack 20 as illustrated in FIG. 9. As illustrated in FIG. 9, the battery pack 20 has four stacks 12; a stack 12A, a stack 12B, a stack 12C, and a stack 12D.

2. Replacing Battery Pack

In the present embodiment, the battery pack 20 mounted on the user's vehicle is replaced in the event of, for example, periodic maintenance such as car inspection or when the user desires to replace the battery pack 20. A degree of degradation of the battery pack 20 may be reported to the user to assist him to decide the replacement of the battery pack 20.

3. Method of Replacing Battery Pack

In the event of the maintenance or inspection, for example, the user's car is brought to, for example, a car dealer. The dealer performs communication with the data station 1000 using the information communication terminal apparatus 2000, wherein the information communication terminal apparatus 2000 requests the data station 1000 to check the battery pack 20 and notify a method of reusing the battery pack 20. Then, the information communication terminal apparatus 2000 obtains the method of reuse.

The information communication terminal apparatus 2000 has a terminal transmitter, a terminal controller, and a terminal receiver. The terminal transmitter transmits information of the battery pack 20 to the data station 1000. The terminal controller requests the data station 1000 to send a notice notifying of a handling method of the battery pack 20. The terminal receiver receives the notice of the handling method of the battery pack 20 from the data station 1000.

The information communication terminal apparatus 2000 requests the data station 1000 to check the identification information stored in the tag 11 of the battery pack 20 mounted on the user's vehicle. The history record presence/absence decision unit 1031 of the data station 1000 determines whether or not the requested identification information of the battery pack 20 is stored in the history record information storage unit 1020. At the time, it may be checked whether or not the history record information of the battery pack 20 relevant to the identification information is stored.

Unless the identification information of the battery pack 20 is stored, the battery handling method decision unit 1032 determines that the battery pack 20 is unreusable and decides to recycle the battery pack 20. When it is determined that the identification information of the battery pack 20 is stored, the battery handling method decision unit 1032 decides a method of reusing the battery pack 20 based on the history record information of the battery pack 20 stored in the history record information storage unit 1020. The method of using the battery pack 20 is chosen from the reusing, rebuilding, and recycling. A decision criterion for choosing the method of reuse may be selected from any of the decision criteria described in the embodiments 1 to 4.

After the method of reusing the battery pack 20 is decided, the data station 1000 notifies the information communication terminal apparatus 2000 of the decided method of reusing the battery pack 20. A serviceman of the car dealer handles the battery pack 20 in accordance with the notified method of reusing the battery pack 20.

3-1. Reusing

When the information communication terminal apparatus 2000 is notified of the decision to reuse the battery pack 20 by the data station 1000, the serviceman of the car dealer mounts a different battery pack 20 on the user's vehicle, or the battery pack 20 removed from the user's vehicle may be put back in the user's vehicle because the battery pack 20 is not so degraded that replacement is necessary.

3-2. Recycling

When the information communication terminal apparatus 2000 is notified of the decision to recycle the battery pack 20 by the data station 1000, the serviceman of the car dealer removes the battery pack 20 from the user's vehicle and serves the battery pack 20 to recycling, for example, contacts a recycling company to let them collect the battery pack 20. Then, the serviceman mounts a different battery pack 20 on the user's vehicle. The battery pack 20 newly mounted on the user's vehicle is less degraded than the replaced one.

3-3. Rebuilding (Option 2)

When the information communication terminal apparatus 2000 is notified of the decision to rebuild the battery pack 20 by the data station 1000, the serviceman of the car dealer rebuilds the battery pack 20. The serviceman combines reusable ones of the stacks 12 of the battery pack 20 with other reusable stacks 12 in the form of a whole battery pack 20, and mounts the newly-combined battery pack 20 on the user's vehicle. As compared to the battery packs 20 prepared by reusing or rebuilding (option 1), less stacks 12 are replaced in the rebuilt battery pack 20, which is described in detail below.

Figure 10:
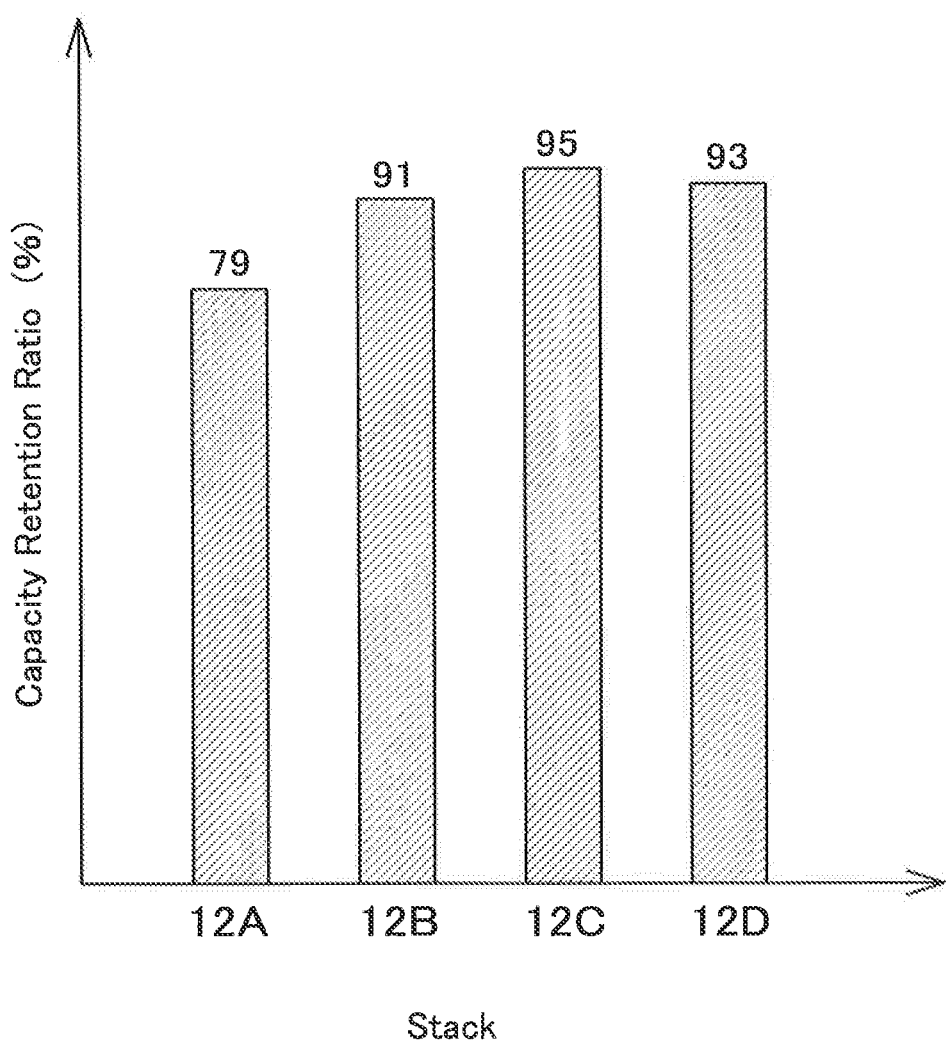
FIG. 10 is a graph showing a capacity retention ratio of a stack in the battery pack in the embodiment 7.

FIG. 10 is a graphical illustration of capacity retention ratios of the stacks 12A, 12B, 12C, and 12D in the battery pack 20 mounted on the user's vehicle. The capacity retention ratio is a ratio of a current full charge capacity to an initial current full charge capacity. Any stack 12 is more degraded as its capacity retention ratio is smaller. To determine the reusability based on the capacity retention ratio is basically the same as described in the modified embodiment of the embodiment 1 (7-1-3. Comparison to Initial Value).

Referring to FIG. 10, the capacity retention ratio of the stack 12A is 79%, the capacity retention ratio of the stack 12B is 91%, the capacity retention ratio of the stack 12C is 95%, and the capacity retention ratio of the stack 12D is 93%, which means that the stack 12A is most degraded. The degree of degradation of the stack 12A is significantly larger than the degrees of degradation of the other stacks 12B, 12C, and 12D.

In the present embodiment, any stacks 12 having the capacity retention ratios equal to or smaller than a threshold of the capacity retention ratio are replaced with different stacks 12. An example of the threshold of the capacity retention ratio is 80%. The threshold of the capacity retention ratio may be differently set. Referring to FIG. 10, the stack 12A alone has the capacity retention ratio equal to or smaller than the threshold of the capacity retention ratio. Therefore, the stack 12A of the battery pack 20 loaded in the vehicle is replaced with a stack 12E.

When it is decided that the battery pack 20 illustrated in FIG. 10 is rebuilt, a stack 12 whose capacity retention ratio is equal to or larger than 91% is chosen as the stack 12E replacing the stack 12A. The degree of degradation of a stack 12 used for replacement should be equal to or smaller than the degrees of degradation of the reusable stacks 12 mounted on the user's vehicle. For example, a stack 12 whose capacity retention ratio is 91% may be chosen as the stack 12E used for replacement. The capacity retention ratio of the stack 12E (91%) is equal to that of the stack 12B (91%) having the lowest capacity retention ratio among the stacks 12B, 12C and 12D.

The newly-built battery pack 20 has the stacks 12E, 12B, 12C, and 12D. This new battery pack 20 is put back in the vehicle, so that the vehicle is equipped with the stacks 12E, 12B, 12C, and 12D which are all good enough to be reused.

The rebuilding according to the present embodiment replaces only seriously degraded one of the stacks 12 of the battery pack 20, reducing a user's cost burden. According to the embodiments 1 to 6, the transportation of batteries is performed by each battery pack to provide the battery pack to the user. In the present embodiment, it is enough that the stacks 12 are transported. Therefore, the present embodiment succeeds in reduction of transportation cost as compared to the embodiments 1 to 6.

4. Battery Packs in Stock

Figure 11:
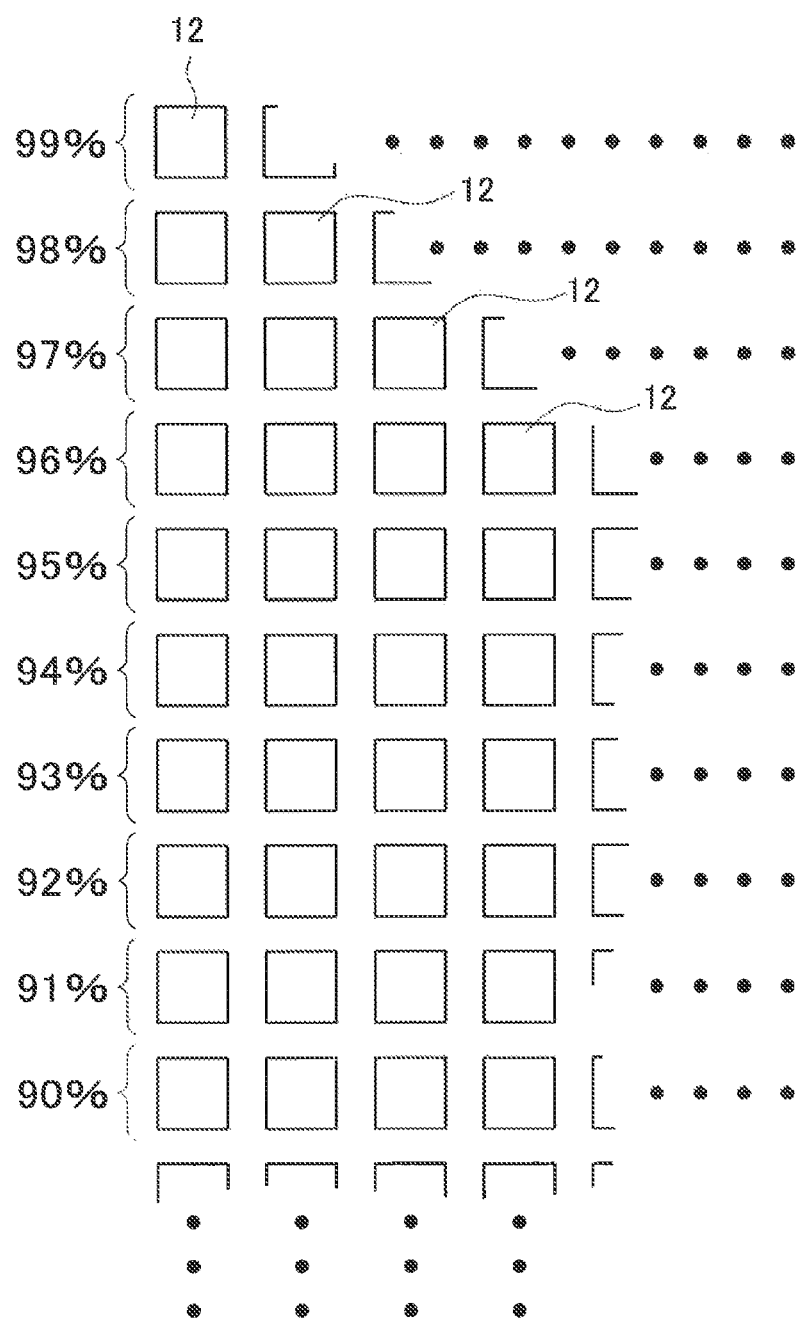
FIG. 11 is a conceptual diagram to explain a stock condition of the stack in the embodiment 7.

The capacity retention ratio of the stack 12E used for replacement is equal to or larger than those of the stack 12B having the lowest capacity retention ratio among the reusable stacks 12B, 12C, and 12D of the original battery pack 20. Therefore, it is necessary to keep stacks 12 having different capacity retention ratios in stock as illustrated in FIG. 11.

When these stacks 12 having different capacity retention ratios are kept in stock in a storage, any suitable ones of the stacks 12 in stock may be picked and used for rebuilding as soon as the user's vehicle is brought to the car dealer.

5. Case of not Employing Rebuilding

Figure 12:
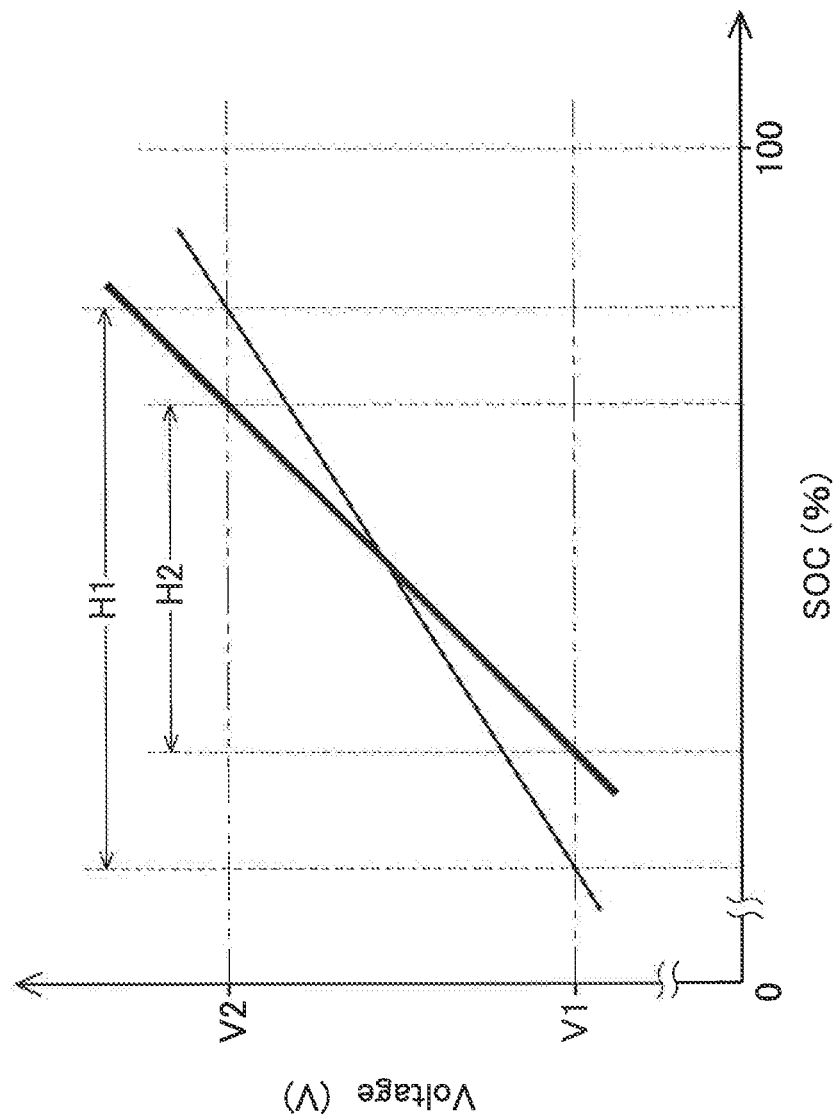
FIG. 12 is a graph showing a relationship between the SCO in the stack and voltage in the embodiment 7.

The rebuilding may not be carried out, which is described below. FIG. 12 is a graph schematically illustrating an SOC-voltage relationship in an open circuit voltage (OCV). A bold line illustrated in FIG. 12 represents measured values of degraded stacks 12. A thin line illustrated in FIG. 12 represents measured values of a new stack 12. Naturally, the new stack 12 has a good capacity retention ratio, whereas the degraded stack 12 has a poor capacity retention ratio.

A horizontal axis of the graph illustrated in FIG. 12 represents SOC, and a vertical axis represents voltages when the stack 12 is used. V1 represents a minimum voltage when the stack 12 is used, and V2 represents a maximum voltage when the stack 12 is used. The stack 12 is recharged and discharged within the voltage range from V1 to V2. The voltage level is kept above V1 and below V2.

H1 represents a range of SOC usable in the new stack 12 (thin line). H2 represents a range of SOC usable in the degraded stack 12 (bold line). As illustrated in FIG. 12, H2 has a range narrower than that of H1, more specifically, the range of SOC usable in the degraded stack 12 (bold line) is narrower than the range of SOC usable in the new stack 12 (thin line).

All of the stacks 12 in the battery pack 20 are recharged and discharged within the voltage range from V1 to V2. For example, a battery pack 20 has a stack 12 illustrated with H1 in FIG. 12 and a stack 12 illustrated with H2 in the same drawing, wherein the battery pack 20 is recharged and discharged in the range of SOC of H2 alone. Even if only one of the stacks 12 in the battery pack 20 is degraded, the usable range of SOC is narrower in all of the stacks 12 of battery pack 20.

Therefore, the running distance of a vehicle equipped with a battery pack 20 having one or more stacks 12 with poor capacity retention ratios is not as long as that of a vehicle equipped with a battery pack 20 having no such stacks 12. Therefore, any of the stacks 12 of the battery pack 20 with a poor capacity retention ratio is desirably replaced with a stack 12 with a sufficient capacity retention ratio so that the vehicle achieves a longer running distance.

6. Modified Embodiment

The modified embodiments of the embodiments 1 to 6 are similarly applied to the embodiment 7.

6-1. Replacing Two or more Stacks

In the present embodiment, only one stack 12A is replaced in the rebuilding. In some cases where a plurality of stacks 12 have a capacity retention ratio equal to or lower than a threshold, for example, two of the stacks 12 is replaced. In this case, similarly, rebuilding can also be performed. Specifically, the two stacks 12 having the capacity retention ratio equal to or lower than the threshold are picked out of the battery pack 20. Other two stacks 12 having a capacity retention ratio equal to or larger than that of one(s) having a low capacity retention among the remaining reusable stacks 12 are mounted to rebuild the battery pack 20.

6-2. Internal Resistance of Battery

In the present embodiment, a stack to be replaced is identified with reference to a full charge capacity. Instead of the full charge capacity, internal resistance of a battery may be used as a criterion. Also in this case, similarly, reusable ones of stacks 12 of a battery pack 20 mounted on a user's vehicle and other reusable stacks 12 are combined to form a rebuilt battery pack 20. The degree of degradation of any stack 12 used for replacement should be equal to or smaller than the degrees of degradation of the reusable stacks 12 mounted on the user's vehicle.

6-3. Combination of Decision Criteria

At least one of or at most three of the full charge capacity, battery internal resistance, and upper-limit voltage exceeding count may be arbitrarily selected and combined. Regardless of how these decision criteria are combined, the reusability of the stacks 12 can be similarly determined.

6-4. Decision Criteria for Reusability

There are other options for the decision criteria on whether or not the battery pack 20 and the stacks 12 are reusable. The reusability of the stacks 12 may be determined based on the full charge capacity and the internal resistance, quantities of change of the full charge capacity and the internal resistance or variations of the quantities of change or by comparing the currently measured values to initial values. The upper-limit voltage exceeding count may be an accumulated value of the upper-limit voltage exceeding count values.

6-5. Reuse of Each Battery Cell

In the present embodiment, the full charge capacity, battery internal resistance, and upper-limit voltage exceeding count are acquired by each of the stacks 12, however, may be acquired by each of the battery cells 13 so that each of the battery cells 13 is determined as reusable or not. Reusable ones of the battery cells 13 are gathered and used in a rebuilt battery pack, wherein the battery cells 13 are constitutive batteries of the battery pack.

6-6. Battery-Mounted Equipment

In the embodiment, the battery mounted on the vehicle was described. However, the embodiment is not necessarily limited to vehicles but is further applicable to any electronic devices. Therefore, the method of reusing battery and the battery management system according to the embodiment are basically applicable to any battery-mounted equipments.

6-7. Reuse of Battery Cell per se

In the embodiment, the vehicle equipped with the battery pack 20 was described. The method of reusing battery and the battery management system according to the embodiment are applicable to any vehicles and other electronic devices equipped with a single battery cell 13. When the method of reusing battery and the battery management system according to the embodiment are applied to these devices, one tag 11 is provided in one battery cell 13.

7. Wrap-Up

As described in detail above, the battery management system 3 in the present embodiment is configured to decide the reusing method of the battery pack 20 based on the history record thereof stored in the history record information storage unit 1020 of the data station 1000. Thus, the present embodiment accomplishes the battery management system capable of appropriately selecting the reusing method of the battery pack 20.

The method of reusing battery according to the present embodiment, wherein it is unnecessary to retest a degree of degradation of any retrieved battery, can be accomplished with less cost.

The embodiment, which is just an example of the invention, does not necessarily restrict the scope of the invention. The invention may be improved or modified within the scope of the invention. For example, the invention is applicable to various types of batteries, including nickel hydride battery, lithium ion battery, and any other batteries.

The present embodiment described so far the battery-equipped vehicle, however, is not necessarily limited to vehicles. The present embodiment is similarly applicable to any electronic devices equipped with secondary batteries.

The invention claimed is:

1. A battery management system including:
   an identification information storage unit for storing therein identification information of a battery pack having a plurality of constitutive batteries;
   a measurement unit for measuring state information relating to a degree of degradation of each of the constitutive batteries;
   a transmitter for transmitting the identification information of the battery pack and measured value data obtained by the measurement unit;
   a receiver for receiving the identification information and the measured value data transmitted from the transmitter;
   a history record information storage unit for storing therein the measured value data received by the receiver as history record information in a manner that associates with the identification information of the battery pack; and
   a decision unit for deciding a method of reusing the battery pack or the constitutive batteries based on the history record information stored in the history record information storage unit,
   wherein the decision unit includes:
   a history record presence/absence decision unit for determining whether or not the history record information of the battery pack is stored in the history record information storage unit; and
   a battery handling method decision unit configured to:
   decide that the battery pack is unreusable when it is determined that the history record information of the battery pack is not stored in the history record information storage unit; and
   determine whether or not the constitutive batteries of the battery pack are reusable based on the history record information of the constitutive batteries when it is determined that the history record information of the battery pack is stored in the history record information storage unit.

2. The battery management system according to claim 1, wherein
   the battery handling method decision unit is configured to:
   decide to reuse the battery pack when it is determined that all of the constitutive batteries of the battery pack are reusable; and:
   decide to recycle the battery pack when it is determined that none of the constitutive batteries of the battery pack is reusable.

3. The battery management system according to claim 2, wherein
   the battery handling method decision unit is configured to:
   when it is determined that a part of the constitutive batteries is reusable but other ones of the constitutive batteries are unreusable,
   decide to gather and combine reusable ones of the constitutive batteries of the battery pack in the form of a battery pack anew, and
   decide to recycle the unreusable constitutive batteries.

4. The battery management system according to any claim 1, wherein
   the measurement unit is configured to measure at least a full charge capacity of the constitutive battery, and
   the battery handling method decision unit is configured to determine that:
   the constitutive battery is unreusable when it is determined that the history record information of the constitutive battery is stored in the history record information storage unit and the full charge capacity is equal to or lower than a predefined reusability threshold of the full charge capacity, and
   the constitutive battery is reusable when it is determined that the history record information of the constitutive battery is stored in the history record information storage unit unless the constitutive battery is determined as unreusable.

5. The battery management system according to claim 1, wherein
   the measurement unit is configured to measure at least a full charge capacity of the constitutive battery, and
   the battery handling method decision unit is configured to determined that:
   the constitutive battery is unreusable when it is determined that the history record information of the constitutive battery is stored in the history record information storage unit and a quantity of change of the full charge capacity is equal to or more than a predefined reusability threshold of the quantity of change of the full charge capacity, and
   the constitutive battery is reusable when it is determined that the history record information of the constitutive battery is stored in the history record information storage unit unless the constitutive battery is determined as unreusable.

6. The battery management system according to claim 1, wherein
the measurement unit is configured to measure at least a full charge capacity of the constitutive battery, and
the battery handling method decision unit is configured to determined that:
the constitutive battery is unreusable when it is determined that the history record information of the constitutive battery is stored in the history record information storage unit and a variation of a quantity of change of the full charge capacity is equal to or more than a predefined reusability threshold of the variation of the quantity of change of the full charge capacity, and
the constitutive battery is reusable when it is determined that the history record information of the constitutive battery is stored in the history record information storage unit unless the constitutive battery is determined as unreusable.

7. The battery management system according to claim 1, wherein
the measurement unit is configured to measure at least a full charge capacity of the constitutive battery, and
the battery handling method decision unit is configured to determined that:
the constitutive battery is unreusable when it is determined that the history record information of the constitutive battery is stored in the history record information storage unit and a difference between the measured full charge capacity and an initial value of the full charge capacity is equal to or more than a predefined reusability threshold of the initial value of the full charge capacity, and
the constitutive battery is reusable when it is determined that the history record information of the constitutive battery is stored in the history record information storage unit unless the constitutive battery is determined as unreusable.

8. The battery management system according to claim 1, wherein
the measurement unit is configured to measure at least internal resistance of the constitutive battery, and
the battery handling method decision unit is configured to determined that:
the constitutive battery is unreusable when it is determined that the history record information of the constitutive battery is stored in the history record information storage unit and the internal resistance is equal to or more than a predefined reusability threshold of the internal resistance, and
the constitutive battery is reusable when it is determined that the history record information of the constitutive battery is stored in the history record information storage unit unless the constitutive battery is determined as unreusable.

9. The battery management system according to claim 1, wherein
the measurement unit is configured to measure at least internal resistance of the constitutive battery, and
the battery handling method decision unit is configured to determined that:
the constitutive battery is unreusable when it is determined that the history record information of the constitutive battery is stored in the history record information storage unit and a quantity of change of the internal resistance is equal to or more than a predefined reusability threshold of the quantity of change of the internal resistance, and
the constitutive battery is reusable when it is determined that the history record information of the constitutive battery is stored in the history record information storage unit unless the constitutive battery is determined as unreusable.

10. The battery management system according to claim 1, wherein
the measurement unit is configured to measure at least internal resistance of the constitutive battery, and
the battery handling method decision unit is configured to determine that:
the constitutive battery is unreusable when it is determined that the history record information of the constitutive battery is stored in the history record information storage unit and a variation of a quantity of change of the internal resistance is equal to or more than a predefined reusability threshold of the variation of the quantity of change of the internal resistance, and
the constitutive battery is reusable when it is determined that the history record information of the constitutive battery is stored in the history record information storage unit unless the constitutive battery is determined as unreusable.

11. The battery management system according to claim 1, wherein
the measurement unit is configured to measure at least internal resistance of the constitutive battery, and
the battery handling method decision unit is configured to determined that:
the constitutive battery is unreusable when it is determined that the history record information of the constitutive battery is stored in the history record information storage unit and a difference between the measured internal resistance and an initial value of the internal resistance is equal to or more than a predefined reusability threshold of the initial value of the internal resistance, and
the constitutive battery is reusable when it is determined that the history record information of the constitutive battery is stored in the history record information storage unit unless the constitutive battery is determined as unreusable.

12. The battery management system according to claim 1, further including a battery-mounted equipment, a battery information management unit, and an external battery charger,
wherein the battery-mounted equipment includes the battery pack having the identification storage unit and the measurement unit,
the battery information management unit includes the receiver, the history record information storage unit, and the decision unit, and
the external battery charger includes the transmitter and a charger for charging the battery pack.

13. The battery management system according to claim 1, further including a battery-mounted equipment, a battery information management unit, and a battery information acquisition device,
wherein the battery-mounted equipment includes the battery pack having the identification storage unit and the measurement unit,
the battery information management unit includes the receiver, the history record information storage unit, and the decision unit, and the battery information acquisition device includes the transmitter and a storage unit for storing therein the state information of the constitutive battery.

14. The battery management system according to claim 1, further including a battery-mounted equipment and a battery information management unit,
wherein the battery-mounted equipment includes the battery pack having the identification information storage unit, the measurement unit, and the transmitter, and
the battery information management unit includes the receiver, the history record information storage unit, and the decision unit.

15. The battery management system according to claim 1, wherein the constitutive battery is a battery cell.

16. The battery management system according to claim 1, wherein the constitutive battery is a stack having a combination of a plurality of battery cells.

17. A battery management system including:
an identification information storage unit for storing therein identification information of a battery having a constitutive battery cell;
a measurement unit for measuring state information relating to a degree of degradation of the constitutive battery;
a transmitter for transmitting the identification information of the battery and measured value data obtained by the measurement unit;
a receiver for receiving the identification information and the measured value data transmitted from the transmitter;
a history record information storage unit for storing therein the measured value data received by the receiver as history record information in a manner that associates with the identification information of the battery; and
a decision unit for deciding a method of reusing the battery based on the history record information stored in the history record information storage unit,
wherein the decision unit includes:
a history record presence/absence decision unit for determining whether or not the history record information of the battery is stored in the history record information storage unit; and
a battery handling method decision unit configured to:
decide that the battery is unreusable when it is determined that the history record information of the battery is not stored in the history record information storage unit, and
determine whether or not the constitutive battery is reusable based on the history record information of the constitutive battery when it is determined that the history record information of the battery is stored in the history record information storage unit, and
the battery handling method decision unit is configured to:
decide to reuse the battery when it is determined that the battery is reusable, and
decide to recycle the battery when it is determined that the battery is unreusable.

18. The battery management system according to claim 17, wherein
the measurement unit is configured to measure at least a full charge capacity of the constitutive battery, and
the battery handling method decision unit is configured to determine that:
the constitutive battery is unreusable when it is determined that the history record information of the constitutive battery is stored in the history record information storage unit and the full charge capacity is equal to or lower than a predefined reusability threshold of the full charge capacity, and the constitutive battery is reusable when it is determined that the history record information of the constitutive battery is stored in the history record information storage unit unless the constitutive battery is determined as unreusable.

19. The battery management system according to claim 17, wherein
the measurement unit is configured to measure at least internal resistance of the constitutive battery, and
the battery handling method decision unit is configured to determined that:
the constitutive battery is unreusable when it is determined that the history record information of the constitutive battery is stored in the history record information storage unit and the internal resistance is equal to or more than a predefined reusability threshold of the internal resistance, and
the constitutive battery is reusable when it is determined that the history record information of the constitutive battery is stored in the history record information storage unit unless the constitutive battery is determined as unreusable.

20. A battery management apparatus includes:
a receiver for receiving identification information of a battery pack and measured value data of state information relating to a degree of degradation of each of constitutive batteries of the battery pack;
a history record information storage unit for storing therein the measured value data received by the receiver as history record information in a manner that associates with the identification information of the battery pack; and
a decision unit for deciding a method of reusing the battery pack or the constitutive batteries based on the history record information stored in the history record information storage unit,
wherein the decision unit includes:
a history record presence/absence decision unit for determining whether or not the history record information of the battery pack is stored in the history record information storage unit; and
a battery handling method decision unit configured to:
decide that the battery pack is unreusable when it is determined that the history record information of the battery pack is not stored in the history record information storage unit; and
determine whether or not the constitutive batteries of the battery pack are reusable based on the history record information of the constitutive batteries when it is determined that the history record information of the battery pack is stored in the history record information storage unit.

21. A battery management apparatus includes:
a receiver for receiving identification information of a battery having a constitutive battery cell and measured value data of state information relating to a degree of degradation of the constitutive battery;
a history record information storage unit for storing therein the measured value data received by the receiver as history record information in a manner that associates with the identification information of the battery; and
a decision unit for deciding a method of reusing the battery based on the history record information stored in the history record information storage unit, wherein the decision unit includes:

a history record presence/absence decision unit for determining whether or not the history record information of the battery is stored in the history record information storage unit; and a battery handling method decision unit configured to:

decide that the battery is unreusable when it is determined that the history record information of the battery is not stored in the history record information storage unit, and determine whether or not the constitutive battery is reusable based on the history record information of the constitutive battery when it is determined that the history record information of the battery is stored in the history record information storage unit, and the battery handling method decision unit is configured to:

decide to reuse the battery when it is determined that the battery is reusable, and decide to recycle the battery when it is determined that the battery is unreusable.

22. A method of reusing battery includes steps of:

measuring state information relating to a degree of degradation of each of a plurality of constitutive batteries of a battery pack by using a measurement unit;

transmitting measured value data outside from a battery-mounted equipment by using a transmitter;

receiving the transmitted measured value data by using a receiver;

storing the received measured value data as history record information of the battery pack and the constitutive batteries in a history record information storage unit; and deciding a method of handling the battery pack or the constitutive batteries based on the history record information by using a decision unit, wherein the decision unit determines whether or not the history record information of the battery pack is stored in the history record information storage unit, the decision unit decides that the battery pack is unreusable when it is determined that the history record information of the battery pack is not stored in the history record information storage unit, and the decision unit determines whether or not the constitutive batteries of the battery pack are reusable based on the history record information of the constitutive batteries when it is determined that the history record information of the battery pack is stored in the history record information storage unit.

23. The method of reusing battery according to claim 22, wherein the decision unit decides to reuse the battery pack when it is determined that all of the constitutive batteries of the battery pack are reusable, the decision unit decides to recycle the battery pack when it is determined that none of the constitutive batteries of the battery pack is reusable, and the decision unit decides to gather and combine reusable ones of the constitutive batteries of the battery pack in the form of a battery pack anew and to recycle the unreusable constitutive batteries, and the constitutive batteries determined as reusable and reusable ones of constitutive batteries of a battery pack mounted on a battery-mounted equipment owned by a user are combined and used in a rebuilt battery pack when the decision unit decides to gather and combine reusable ones of the constitutive batteries of the battery pack in the form of a battery pack anew.

24. The method of reusing battery according to claim 23, wherein a degree of degradation of each of the constitutive batteries combined with the constitutive batteries mounted on the battery-mounted equipment is equal to or lower than a degree of degradation of a most degraded one in reusable ones of the constitutive batteries mounted on the battery-mounted equipment.

25. An information communication terminal apparatus including:

a terminal transmitter for transmitting information to a battery management apparatus;

a terminal controller for requesting the battery management apparatus to decide a method of reusing a battery pack; and a terminal receiver for receiving the information from the battery management apparatus, wherein the battery management apparatus includes:

a history record information storage unit for storing therein identification information of a battery pack and measured value data of state information of constitutive batteries included in the battery pack as history record information associated with each other;

a history record presence/absence decision unit for determining whether or not the history record information of the battery pack is stored in the history record information storage unit; and a battery handling method decision unit for determining whether or not the constitutive batteries of the battery pack are reusable based on the history record information of the constitutive batteries, wherein the terminal receiver receives a notice notifying of a decision not to use the battery pack determined as unreusable when it is determined that the history record information of the battery pack is not stored in the history record information storage unit, and a notice notifying of a method of reusing the batteries decided by the battery handling method decision unit when it is determined that the history record information of the battery pack is stored in the history record information storage unit.

* * * * *